(12) United States Patent
Haga et al.

(10) Patent No.: US 11,428,745 B2
(45) Date of Patent: Aug. 30, 2022

(54) METHOD OF ESTIMATING DETERIORATED STATE OF SECONDARY BATTERY AND SECONDARY BATTERY SYSTEM

(71) Applicant: TOYOTA JIDOSHA KABUSHIKI KAISHA, Toyota (JP)

(72) Inventors: Nobuyasu Haga, Seto (JP); Hiroshi Hamaguchi, Toyota (JP); Ryo Kanada, Toyota (JP); Takanori Soejima, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 1057 days.

(21) Appl. No.: 16/059,118

(22) Filed: Aug. 9, 2018

(65) Prior Publication Data
US 2019/0064282 A1 Feb. 28, 2019

(30) Foreign Application Priority Data
Aug. 23, 2017 (JP) .............................. JP2017-159955

(51) Int. Cl.
*G01R 31/392* (2019.01)
*H01M 10/617* (2014.01)
(Continued)

(52) U.S. Cl.
CPC ............. *G01R 31/392* (2019.01); *B60L 3/12* (2013.01); *B60L 58/12* (2019.02); *B60L 58/13* (2019.02);
(Continued)

(58) Field of Classification Search
CPC .................. G01R 31/392; G01R 31/3842; G01R 31/367; G01R 31/347; G01R 31/007;
(Continued)

(56) References Cited

U.S. PATENT DOCUMENTS

| 7,362,074 B2 * | 4/2008 | Iwane .................. G01R 31/392 |
| | | 320/132 |
| 2012/0316815 A1 * | 12/2012 | Morigaki ............. G01R 31/392 |
| | | 702/63 |

(Continued)

FOREIGN PATENT DOCUMENTS

| CN | 101639523 A | 2/2010 |
| JP | 2005-221487 A | 8/2005 |

(Continued)

*Primary Examiner* — Daniel R Miller
*Assistant Examiner* — Eric Sebastian Von Wald
(74) *Attorney, Agent, or Firm* — Sughrue Mion, PLLC

(57) ABSTRACT

A method of estimating a deteriorated state of a battery includes steps S102 to S110. S102 is a step of obtaining a voltage and a current of the battery a plurality of times for a data acquisition period. S104 is a step of calculating an amount of change in current, an amount of change in temperature, and an amount of change in SOC during the data acquisition period. S106 is a step of obtaining an allowable amount of change in current, an allowable amount of change in temperature, and an allowable amount of change in SOC based on an average temperature. S110 is a step of calculating an impedance component for each frequency bandwidth based on the voltage and the current by subjecting the voltage and the current to Fourier transform when all amounts of change are smaller than the allowable amounts of change.

6 Claims, 24 Drawing Sheets

(51) Int. Cl.
*H01M 10/42* (2006.01)
*G01R 31/3842* (2019.01)
*B60L 58/12* (2019.01)
*B60L 58/13* (2019.01)
*B60L 3/12* (2006.01)
*B60L 58/21* (2019.01)
*B60L 58/14* (2019.01)
*H01M 10/625* (2014.01)
*H01M 10/633* (2014.01)
*G01R 31/367* (2019.01)
*G01R 31/00* (2006.01)
*G01R 31/374* (2019.01)
*H02J 7/00* (2006.01)

(52) U.S. Cl.
CPC ............... *B60L 58/14* (2019.02); *B60L 58/21* (2019.02); *G01R 31/367* (2019.01); *G01R 31/3842* (2019.01); *H01M 10/42* (2013.01); *H01M 10/425* (2013.01); *H01M 10/617* (2015.04); *H01M 10/625* (2015.04); *H01M 10/633* (2015.04); *H02J 7/0024* (2013.01); B60L 2240/545 (2013.01); B60L 2240/547 (2013.01); B60L 2240/549 (2013.01); G01R 31/007 (2013.01); G01R 31/374 (2019.01); H01M 2220/20 (2013.01)

(58) Field of Classification Search
CPC .......... G01R 31/389; G01R 31/3662; G01R 3/3606; G01R 31/3648; G01R 27/02; G01R 31/3627; G01R 31/3679; H01M 10/617; H01M 10/625; H01M 10/633; H01M 10/42; H01M 10/425; H01M 2220/20; H01M 4/587; H01M 10/0525; H01M 10/48; B60L 58/12; B60L 58/21; B60L 58/13; B60L 58/14; B60L 3/12; B60L 2240/545; B60L 2240/547; B60L 2240/549; H02J 7/0024; Y02E 60/10; G01B 7/24

See application file for complete search history.

(56) References Cited

U.S. PATENT DOCUMENTS

| | | | | |
|---|---|---|---|---|
| 2013/0030736 | A1* | 1/2013 | Tanaka | G01R 31/392 |
| | | | | 702/63 |
| 2015/0276889 | A1 | 10/2015 | Osaka et al. | |
| 2015/0362557 | A1* | 12/2015 | Takashima | G01R 31/3842 |
| | | | | 324/426 |
| 2017/0328957 | A1* | 11/2017 | Suzuki | H01M 10/482 |
| 2018/0080990 | A1* | 3/2018 | Seo | G01R 31/382 |
| 2018/0252776 | A1 | 9/2018 | Takechi et al. | |
| 2018/0299511 | A1* | 10/2018 | Kim | G01R 31/392 |
| 2020/0139844 | A1* | 5/2020 | Gelso | G01R 31/3647 |

FOREIGN PATENT DOCUMENTS

| | | | |
|---|---|---|---|
| JP | 2013-195232 A | 9/2013 | |
| JP | 2015-190918 A | 11/2015 | |
| WO | WO-9415222 A1 * | 7/1994 | .......... G01R 31/389 |
| WO | WO-2016208745 A1 * | 12/2016 | .......... G01R 31/389 |
| WO | 2017/047192 A1 | 3/2017 | |

* cited by examiner

FIG.7 <FIRST EMBODIMENT>

| AVERAGE TEMPERATURE $TB_{ave}$ | ... | −10°C ~0°C | 0°C ~10°C | 10°C ~20°C | ... |
|---|---|---|---|---|---|
| ALLOWABLE AMOUNT OF CHANGE IN CURRENT $\Delta IB_{max}$ | ... | 20A | 30A | 40A | ... |
| ALLOWABLE AMOUNT OF CHANGE IN TEMPERATURE $\Delta TB_{max}$ | ... | 5°C | 10°C | 15°C | ... |
| ALLOWABLE AMOUNT OF CHANGE IN SOC $\Delta SOC_{max}$ | ... | 4% | 6% | 8% | ... |

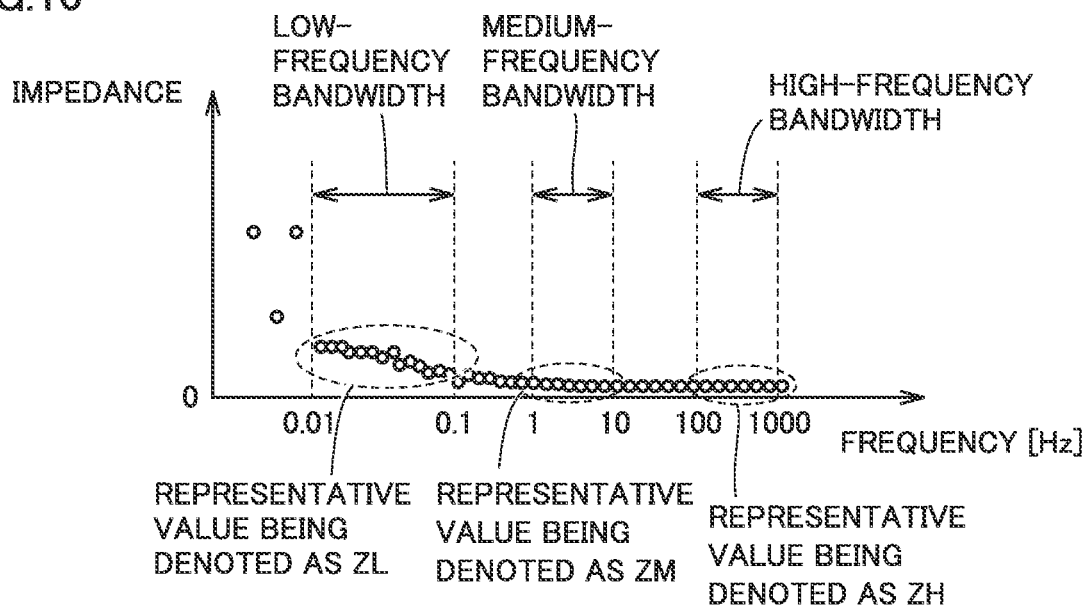

| AVERAGE TEMPERATURE TB$_{ave}$ | ... | −10°C ~0°C | 0°C ~10°C | 10°C ~20°C | ... |
|---|---|---|---|---|---|
| PROHIBITION THRESHOLD VALUE TH1 [A·s] | ... | 80 | 100 | 120 | ... |
| RESUMPTION THRESHOLD VALUE TH2 [A·s] | ... | 40 | 50 | 60 | ... |

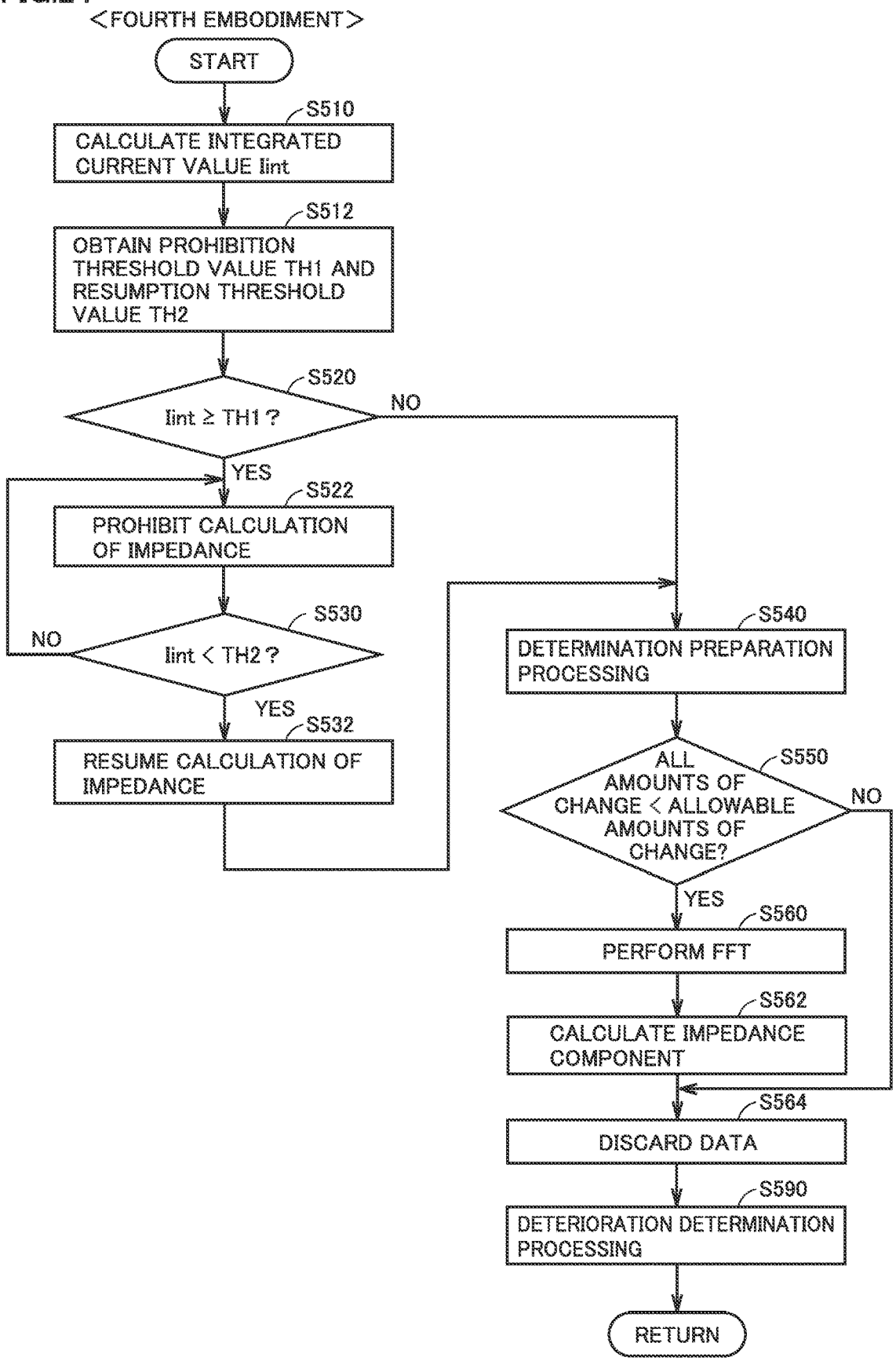

METHOD OF ESTIMATING DETERIORATED STATE OF SECONDARY BATTERY AND SECONDARY BATTERY SYSTEM

This nonprovisional application is based on Japanese Patent Application No. 2017-159955 filed with the Japan Patent Office on Aug. 23, 2017, the entire contents of which are hereby incorporated by reference.

BACKGROUND

Field

The present disclosure relates to a method of estimating a deteriorated state of a secondary battery and a secondary battery system and more particularly to a secondary battery deteriorated state estimation method of estimating a deteriorated state of a secondary battery mounted on a vehicle and a secondary battery system used as being mounted on a vehicle.

Description of the Background Art

Vehicles incorporating secondary batteries for running have increasingly been used in recent years. Since the secondary batteries mounted on such vehicles may deteriorate in accordance with how they are used or an environment where they are used or with lapse of time, highly accurate estimation of a deteriorated state (state of health (SOH)) of the secondary batteries has been demanded. Then, a method of estimating a deteriorated state of a secondary battery based on an impedance (an internal resistance) of the secondary battery has been proposed.

For example, according to a method disclosed in Japanese Patent Laying-Open No. 2005-221487, a current value and a voltage value are measured while charging and discharging currents of various waveforms without periodicity flow in a secondary battery are measured. By subjecting the measured current value and voltage value to Fourier transform, an impedance at a prescribed frequency is calculated based on the current value and the voltage value subjected to Fourier transform.

SUMMARY

An impedance of a secondary battery (an impedance component for each frequency bandwidth) may be dependent on a current, a temperature, and a state of charge (SOC). Therefore, in Fourier transform, data (a voltage value and a current value) has to be obtained for a prescribed period, whereas a current, a temperature, or an SOC of the secondary battery may vary while data is being obtained. In such a case, influence by dependency on a current, a temperature, or an SOC may not accurately be reflected on an impedance and the impedance may not highly accurately be calculated. Consequently, accuracy in estimation of a deteriorated state of a secondary battery may be lowered.

The present disclosure was made to solve the problem above and an object thereof is to improve accuracy in estimation of a deteriorated state of a secondary battery in a deteriorated state estimation method of estimating a deteriorated state of a secondary battery mounted on a vehicle.

Another object of the present disclosure is to improve accuracy in estimation of a deteriorated state of a secondary battery in a secondary battery system configured to be mounted on a vehicle.

A method of estimating a deteriorated state of a secondary battery according to one aspect of the present disclosure is performed by a control device mounted on a vehicle. The method of estimating a deteriorated state of a secondary battery includes first to fifth steps. The first step is a step of obtaining a plurality of times, a voltage value and a current value of the secondary battery mounted on the vehicle for a prescribed period while the vehicle is driven and storing the voltage value and the current value in a memory. The second step is a step of calculating an amount of change in current of the secondary battery, an amount of change in temperature of the secondary battery, and an amount of change in SOC of the secondary battery during the prescribed period. The third step is a step of obtaining an allowable amount of change in current representing an allowable upper limit of the amount of change in current, an allowable amount of change in temperature representing an allowable upper limit of the amount of change in temperature, and an allowable amount of change in SOC representing an allowable upper limit of the amount of change in SOC which are determined for each temperature, each current, or each SOC of the secondary battery during the prescribed period from the temperature, the current, or the SOC of the secondary battery. The fourth step is a step of calculating, by subjecting voltage values and current values of the secondary battery obtained the plurality of times and stored in the memory to frequency conversion (Fourier transform), an impedance component for each frequency bandwidth of the secondary battery based on the frequency-converted voltage values and current values when all of a current condition that the amount of change in current is smaller than the allowable amount of change in current, a temperature condition that the amount of change in temperature is smaller than the allowable amount of change in temperature, and an SOC condition that the amount of change in SOC is smaller than the allowable amount of change in SOC are satisfied. The fifth step is a step of estimating a deteriorated state of the secondary battery in a deterioration mode in accordance with each frequency bandwidth by using the impedance component for each frequency bandwidth.

A secondary battery system according to another aspect of the present disclosure is used as being mounted on a vehicle. The secondary battery system includes a secondary battery and an estimator including a memory and configured to estimate a deteriorated state of the secondary battery. The estimator obtains a voltage value and a current value of the secondary battery a plurality of times for a prescribed period while the vehicle is driven and has a memory store the voltage value and the current value, calculates an amount of change in current of the secondary battery, an amount of change in temperature of the secondary battery, and an amount of change in SOC of the secondary battery during the prescribed period, obtains an allowable amount of change in current representing an allowable upper limit of the amount of change in current, an allowable amount of change in temperature representing an allowable upper limit of the amount of change in temperature, and an allowable amount of change in SOC representing an allowable upper limit of the amount of change in SOC which are determined for each current or each SOC or each temperature of the secondary battery during the prescribed period from the temperature, the current, or the SOC of the secondary battery, calculates, by subjecting voltage values and current values of the secondary battery obtained the plurality of times and stored in the memory to frequency conversion, an impedance component for each frequency bandwidth of the secondary battery from the frequency-converted voltage values and current values when all of a current condition that the amount of change in current is smaller than the allowable amount of change in current, a temperature condition that the amount of change in temperature is smaller than the allowable amount of change in temperature, and an SOC condition that the amount of change in SOC is smaller than the allowable amount of change in SOC are satisfied, and estimates a deteriorated state of the secondary battery in a deterioration mode in accordance with each frequency bandwidth by using the impedance component for each frequency bandwidth.

Preferably, the obtaining an allowable amount of change (the third step) includes obtaining the allowable amount of change in current, the allowable amount of change in temperature, and the allowable amount of change in SOC from an average temperature, an average current, or an average SOC of the secondary battery by referring to correspondence (for example, a map) between the average temperature, the average current, or the average SOC of the secondary battery during the prescribed period and the allowable amount of change in current, the allowable amount of change in temperature, and the allowable amount of change in SOC.

According to the method or the feature, when all of the current condition, the temperature condition, and the SOC condition are satisfied during the prescribed period, an impedance (an impedance component for each frequency bandwidth) of the secondary battery is calculated. In other words, when at least one of the current, the temperature, and the SOC of the secondary battery varies during the prescribed period by a larger amount than a corresponding allowable amount of change, the voltage value and the current value obtained during the prescribed period are not subjected to frequency conversion and not used for calculation of an impedance. Since influence on the impedance by dependency on the current, the temperature, and the SOC can appropriately be reflected on a result of calculation of the impedance, accuracy in estimation of a deteriorated state of the secondary battery can be improved.

Preferably, the control device sets an impedance component in a frequency bandwidth where deterioration of the secondary battery is more likely to proceed to be higher in frequency of calculation of the impedance component, among impedance components for each frequency bandwidth.

According to the method, by setting a frequency of calculation of an impedance component in a frequency bandwidth where deterioration of the secondary battery is more likely to proceed to be higher, an impedance component in a frequency bandwidth where deterioration is more likely to proceed can be monitored with higher importance being placed thereon.

Preferably, the method of estimating a deteriorated state of a secondary battery further includes prohibiting calculation of the impedance component for each frequency bandwidth in spite of all of the current condition, the temperature condition, and the SOC condition being satisfied, when a parameter representing at least one of unevenness in three distributions below which affects a resistance of the secondary battery during the prescribed period (unevenness of a temperature distribution in the secondary battery, unevenness of a salt concentration distribution in an electrolyte of the secondary battery, and unevenness of a concentration distribution of a charge transport material in an active material of the secondary battery) is higher than a reference value.

Preferably, the method of estimating a deteriorated state of a secondary battery further includes resuming calculation of the impedance component for each frequency bandwidth when all of the current condition, the temperature condition, and the SOC condition are satisfied and when the parameter is lower than another reference value smaller than the reference value.

According to the method, when the parameter is higher than the reference value, calculation of an impedance component for each frequency bandwidth is prohibited, with such determination being made that unevenness of the temperature distribution in the secondary battery, unevenness of the salt concentration distribution in the electrolyte, or unevenness of the concentration distribution of the charge transport material in the active material has highly likely occurred. Thereafter, when the parameter is lower than another reference value, calculation of the impedance component is resumed, with such determination that unevenness of each distribution has been relaxed over time being made. Since it is thus ensured that there is no unevenness in each distribution at the time of calculation of an impedance component for each frequency bandwidth, accuracy in calculation of an impedance component can be improved. Since calculation of an impedance component is resumed as necessary, opportunities for calculation of an impedance component can sufficiently be obtained.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 9 is a diagram showing one example of a map.

FIG. 10 is a diagram showing one example of a result of calculation of the impedance component.

FIG. 23 is a diagram showing one example of a map for setting a prohibition threshold value and a resumption threshold value.

FIG. 24 is a flowchart showing a method of determining a deteriorated state of the battery in the fourth embodiment.

DESCRIPTION OF THE PREFERRED EMBODIMENTS

Figure 1:
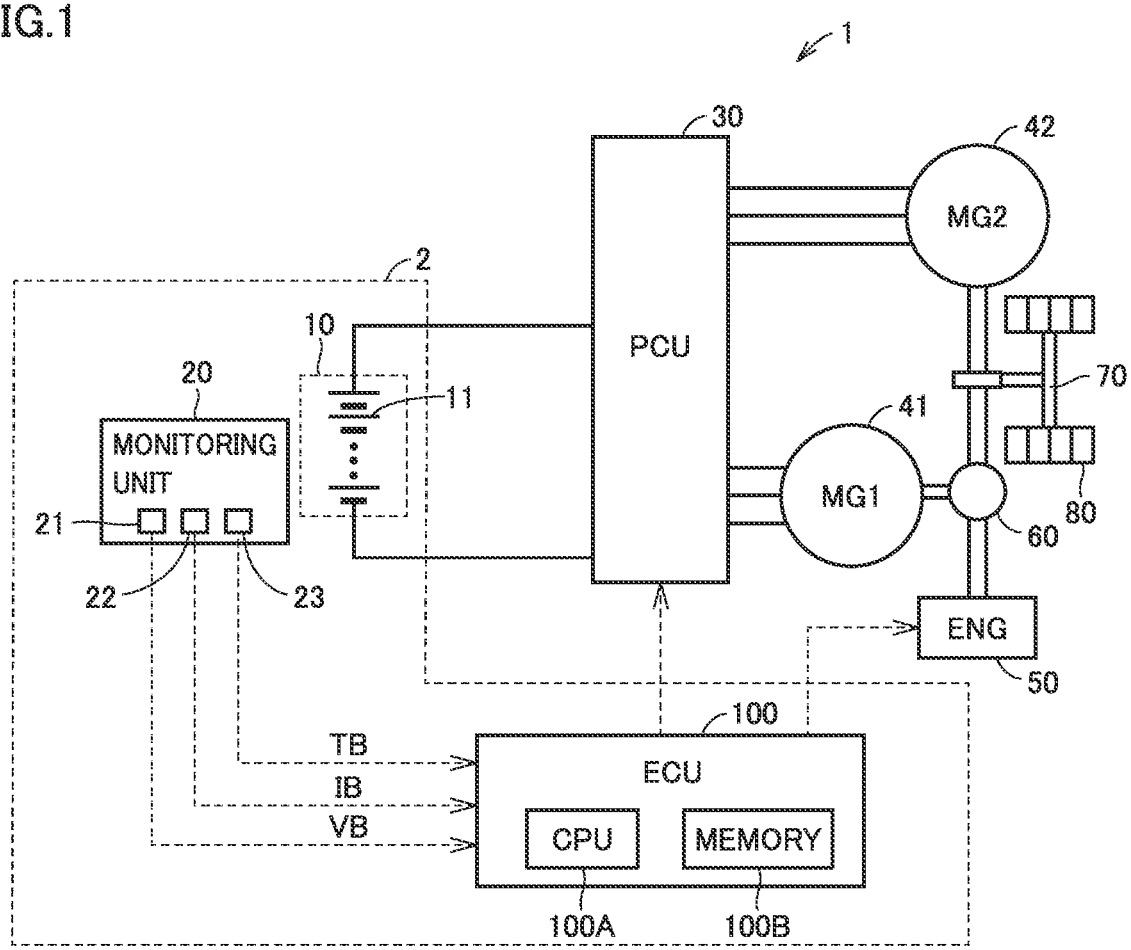
FIG. 1 is a diagram schematically showing an overall configuration of a vehicle on which a secondary battery system according to a first embodiment is mounted.

An embodiment of the present disclosure will be described below in detail with reference to the drawings. The same or corresponding elements in the drawings have the same reference characters allotted and description thereof will not be repeated.

First Embodiment

<Configuration of Secondary Battery System>

FIG. 1 is a diagram schematically showing an overall configuration of a vehicle on which a secondary battery system according to a first embodiment is mounted. Referring to FIG. 1, a vehicle 1 is representatively a hybrid vehicle. A battery system according to the present disclosure, however, is applicable to general vehicles which generate motive power with electric power supplied from a secondary battery system, without being limited to the hybrid vehicle (including a plug-in hybrid vehicle). Therefore, vehicle 1 may be an electric vehicle or a fuel cell vehicle.

Vehicle 1 includes a secondary battery system 2, a power control unit (PCU) 30, motor generators 41 and 42, an engine 50, a power split device 60, a driveshaft 70, and a drive wheel 80. Secondary battery system 2 includes a battery 10, a monitoring unit 20, and an electronic control unit (ECU) 100.

Engine 50 is an internal combustion engine which outputs motive power by converting combustion energy generated at the time of combustion of an air-fuel mixture of air and fuel into kinetic energy of a motion element such as a piston and a rotor.

Power split device 60 includes, for example, a planetary gear (not shown) including three rotation axes of a sun gear, a carrier, and a ring gear. Power split device 60 splits motive power output from engine 50 into motive power for driving motor generator 41 and motive power for driving drive wheel 80.

Each of motor generators 41 and 42 is an alternating-current (AC) rotating electric machine, and it is, for example, a three-phase AC synchronous motor having a permanent magnet (not shown) embedded in a rotor. Motor generator 41 is mainly used as a power generator driven by engine 50 with power split device 60 being interposed. Electric power generated by motor generator 41 is supplied to motor generator 42 or battery 10 through PCU 30.

Motor generator 42 mainly operates as a motor and drives drive wheel 80. Motor generator 42 is driven upon receiving at least one of electric power from battery 10 and electric power generated by motor generator 41, and driving force from motor generator 42 is transmitted to driveshaft 70. During braking or deceleration on a downward slope of the vehicle, motor generator 42 carries out regeneration by operating as the generator. Electric power generated by motor generator 42 is supplied to battery 10 through PCU 30.

Battery 10 includes a plurality of cells 11. Each cell 11 is, for example, a secondary battery such as a lithium ion secondary battery or a nickel-metal hydride battery. Battery 10 stores electric power for driving motor generators 41 and 42 and supplies electric power to motor generators 41 and 42 through PCU 30. Battery 10 is charged upon receiving generated electric power through PCU 30 while motor generators 41 and 42 generate electric power.

Monitoring unit 20 includes a voltage sensor 21, a current sensor 22, and a temperature sensor 23. Voltage sensor 21 detects a voltage VB of a block (module) constituted of a plurality of cells. Current sensor 22 detects a current IB input to and output from battery 10. Temperature sensor 23 detects a temperature TB for each cell 11. Each sensor outputs a signal indicating a result of detection to ECU 100. A configuration of each of battery 10 and monitoring unit 20 will be described in further detail with reference to FIG. 2.

PCU 30 bidirectionally converts electric power between battery 10 and motor generators 41 and 42 in response to a control signal from ECU 100. PCU 30 is configured to individually control states of motor generators 41 and 42, and for example, it can set motor generator 41 to a regenerating state (a power generating state) while it can set motor generator 42 to a power running state. PCU 30 includes, for example, two inverters provided in correspondence with motor generators 41 and 42, respectively, and a converter which boosts a direct-current (DC) voltage supplied to each inverter to a voltage higher than an output voltage of battery 10 (none of which is shown).

ECU 100 includes a central processing unit (CPU) 100A, a memory (a read only memory (ROM) and a random access memory (RAM)) 100B, and an input and output port (not shown) for input and output of various signals. ECU 100 performs various types of processing for controlling vehicle 1 to a desired state based on a signal received from each sensor and a program and a map stored in memory 100B.

Specifically, ECU 100 estimates a state of charge (SOC) of battery 10. A known technique such as a current integration method can be employed for estimation of an SOC. ECU 100 controls charging and discharging of battery 10 by controlling engine 50 and PCU 30. ECU 100 calculates an impedance (internal resistance) of battery 10. An impedance of battery 10 can be calculated as a ratio (=VB/IB) between voltage VB and (absolute value of) current IB. Calculation of an impedance will be described in detail later.

Figure 2:
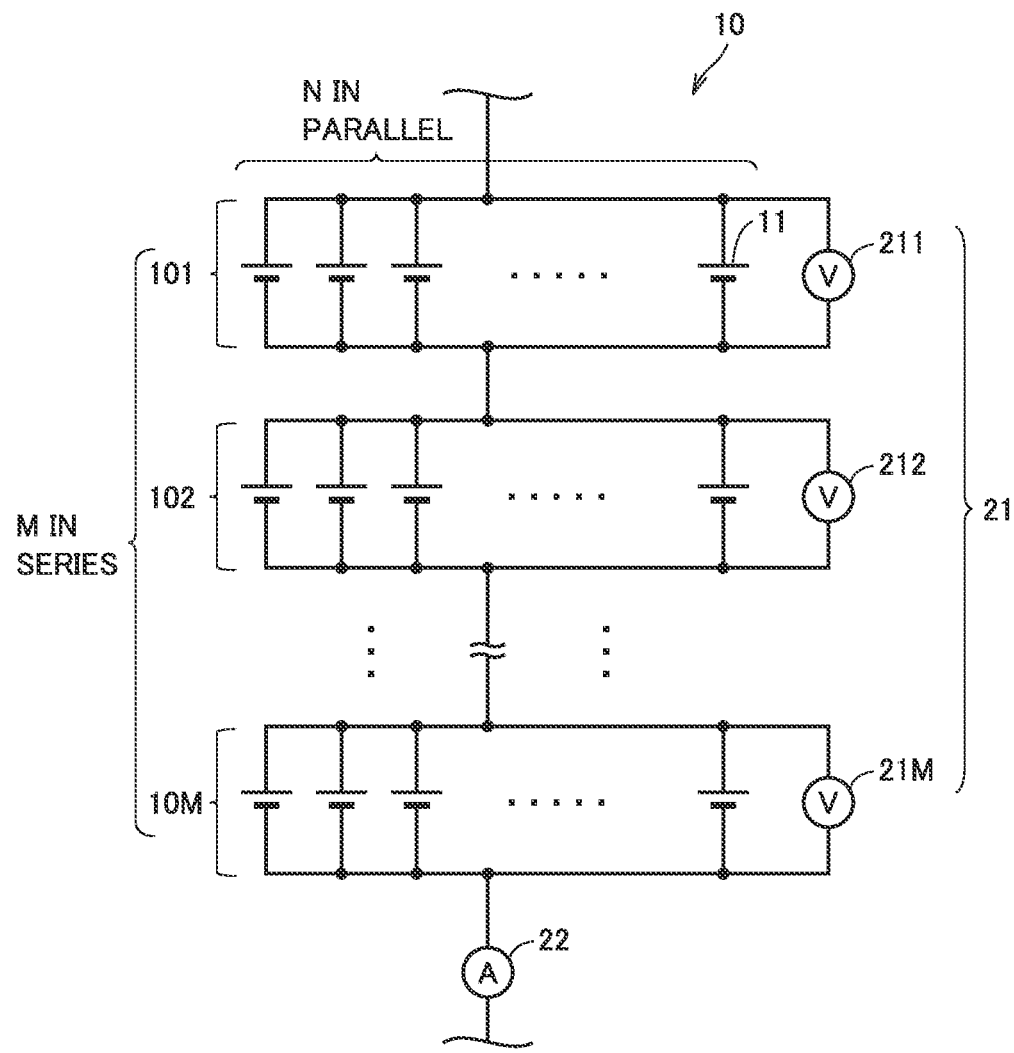
FIG. 2 is a diagram for illustrating a configuration of a battery and a monitoring unit in further detail.

FIG. 2 is a diagram for illustrating a configuration of battery 10 and monitoring unit 20 in further detail. Referring to FIGS. 1 and 2, in battery 10, a plurality of cells 11 are connected in parallel to implement blocks 101 to 10M, and a plurality of blocks 101 to 10M are connected in series to implement battery 10. More specifically, battery 10 includes M blocks 101 to 10M connected in series. Each block includes N cells 11 connected in parallel. M and N are natural numbers not smaller than two.

A voltage sensor 211 detects a voltage of block 101. Voltage sensor 211 detects voltages VBs of N cells implementing block 101. This is also applicable to voltage sensors 212 to 21M. Current sensor 22 detects current IB which flows to each of blocks 101 to 10M.

Though monitoring by the voltage sensor is not limited to monitoring for each block but monitoring may be performed for each cell 11 or for each set of a plurality of adjacent cells 11 (the number of cells being smaller than the number of cells in a block). When there is no particular influence by the internal configuration of battery 10 and it is not necessary to distinguish blocks 101 to 10M from one another or distinguish a plurality of cells 11 from one another, the battery is comprehensively denoted as battery 10.

While vehicle 1 configured as above is running, voltage VB, current IB, temperature TB, and an SOC of battery 10 may vary over time. Vehicle 1 "being running" should only be defined as such a state that vehicle 1 is turned on and is able to run, and may include also a state that vehicle 1 temporarily stops.

Figure 3:
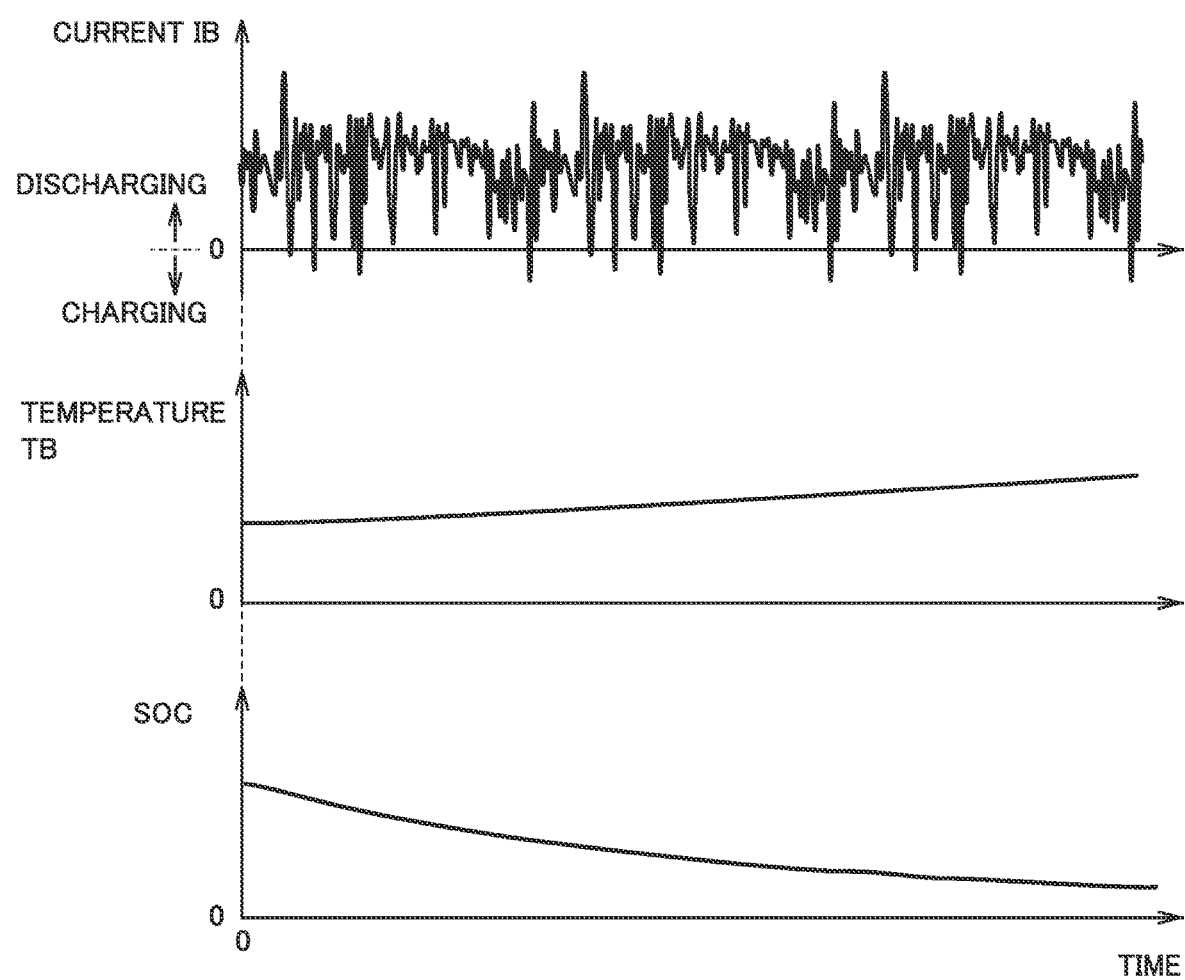
FIG. 3 is a diagram showing one example of change over time in current, temperature, and SOC of the battery while the vehicle is running.
Figure 8:
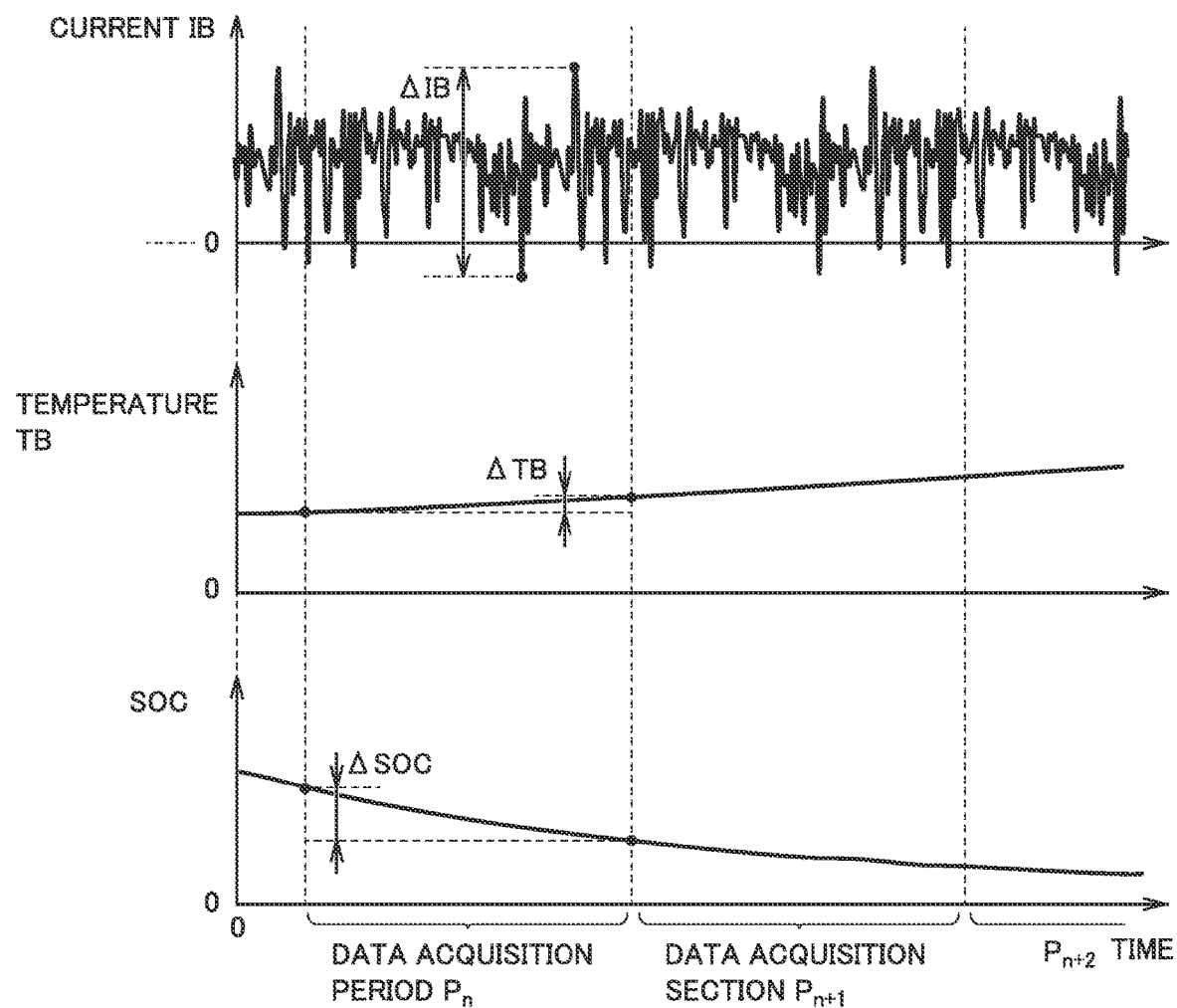
FIG. 8 is a diagram showing one example of change over time in data (a voltage, a current, and a temperature) during a certain data acquisition period.

FIG. 3 is a diagram showing one example of change over time in current IB, temperature TB, and SOC of battery 10 while vehicle 1 is running. In FIG. 3 and FIG. 8 which will be described later, the abscissa represents elapsed time. The ordinate represents current IB, temperature TB, and an SOC from the top. Though voltage VB may also irregularly vary similarly to current IB, voltage VB is not shown below in order to prevent the drawings from becoming complicated.

As shown in FIG. 3, since variation in temperature TB and SOC takes time to some extent, temperature TB and the SOC smoothly vary. In contrast, while vehicle 1 is running, current IB may irregularly vary. In calculation of an impedance of battery 10 by using such irregularly varying current IB, frequency dependency of an impedance component is taken into account in the present embodiment as described below.

<Calculation of Impedance>

Figure 4:
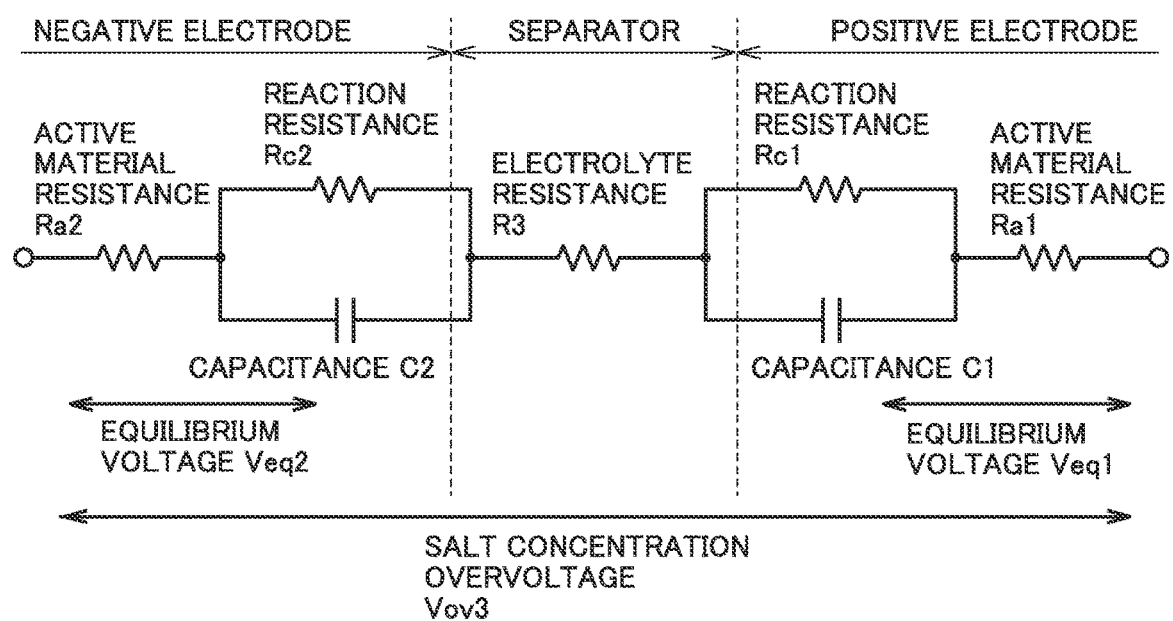
FIG. 4 is a diagram for illustrating an impedance component of the battery.

FIG. 4 is a diagram for illustrating an impedance component of battery 10. FIG. 4 shows one example of an equivalent circuit diagram of a positive electrode, a negative electrode, and a separator of battery 10 (cell 11). In general, an impedance of a secondary battery is categorized into a DC resistance, a reaction resistance, and a diffusion resistance.

The DC resistance refers to an impedance component associated with migration of ions and electrons between the positive electrode and the negative electrode. The DC resistance increases with unevenness of a distribution of a salt concentration in an electrolyte when a high load is applied to the secondary battery (when a high voltage is applied or a high current flows). The DC resistance is represented in the equivalent circuit diagram as an active material resistance Ra1 of the positive electrode, an active material resistance Ra2 of the negative electrode, and an electrolyte resistance R3 of the separator.

The reaction resistance refers to an impedance component associated with supply and reception of charges (charge transfer) at an interface between the electrolyte and an active material (surfaces of a positive electrode active material and a negative electrode active material). The reaction resistance increases with growth of a film on the interface between the active material and the electrolyte when the secondary battery with a high SOC is in a high-temperature environment. The reaction resistance is represented in the equivalent circuit diagram as a resistance component Rc1 of the positive electrode and a resistance component Rc2 of the negative electrode.

The diffusion resistance refers to an impedance component associated with diffusion of salt in the electrolyte or a charge transport material in the active material. The diffusion resistance increases with fracture of the active material when a high load is applied. The diffusion resistance is determined by an equilibrium voltage Veq1 generated at the positive electrode, an equilibrium voltage Veq2 generated at the negative electrode, and a salt concentration overvoltage Vov3 generated in the cell (an overvoltage due to production of a distribution of a salt concentration in the active material within the separator).

Various impedance components are thus included in the impedance of battery 10 and the impedance components correspond to different deterioration modes. Time required for responding to current IB (a response time) is different for each impedance component. An impedance component relatively short in response time can follow variation in voltage VB at a high frequency. On the other hand, an impedance component relatively long in response time cannot follow variation in voltage VB at a high frequency. Therefore, as will be described below, for each frequency bandwidth of a low-frequency bandwidth, a medium-frequency bandwidth, and a high-frequency bandwidth, impedance components (or deterioration modes) of battery 10 dominant in each frequency bandwidth can be distinguished from one another.

Figure 5:
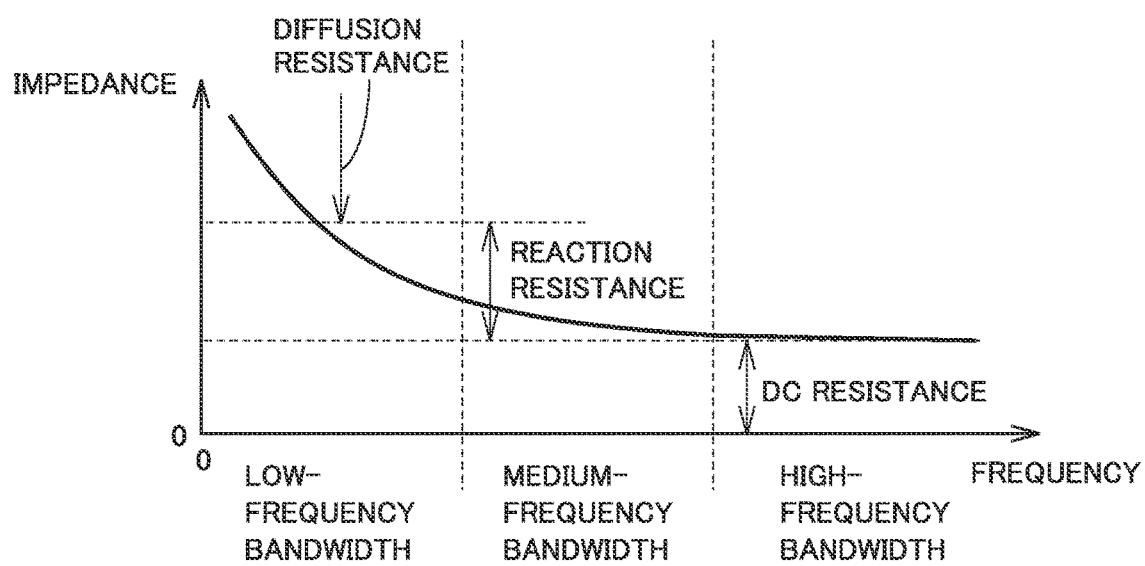
FIG. 5 is a diagram for illustrating frequency dependency of the impedance component of the battery.

FIG. 5 is a diagram for illustrating frequency dependency of an impedance component of battery 10. In FIG. 5, the abscissa represents a frequency of current IB (or voltage VB) and the ordinate represents an impedance of battery 10.

As shown in FIG. 5, a DC resistance of battery 10 is mainly reflected on an impedance component measured when a frequency of current IB is included in the high-frequency bandwidth (which is referred to as a "high-frequency impedance component").

A reaction resistance and a DC resistance of battery 10 are mainly reflected on an impedance component measured when a frequency of current IB is included in the medium-frequency bandwidth (which is referred to as a "medium-frequency impedance component"). Therefore, for example, a reaction resistance can be calculated based on a difference between a medium-frequency impedance component and a high-frequency impedance component.

All of a reaction resistance, a DC resistance, and a diffusion resistance of battery 10 are reflected on an impedance component measured when a frequency of current IB is included in the low-frequency bandwidth (which is referred to as a "low-frequency impedance component"). Therefore, for example, a diffusion resistance can be calculated based on a difference between a low-frequency impedance component and a medium-frequency impedance component.

By thus calculating an impedance component for each frequency bandwidth, which of the DC resistance, the reaction resistance, and the diffusion resistance has increased can be identified. For example, by finding how much a resistance (any of the DC resistance, the reaction resistance, and the diffusion resistance) at the current time point has increased from a resistance in an initial state of battery 10, a factor for deterioration of battery 10 (a type of deterioration) can be estimated or a degree of progress of deterioration for each factor can be estimated. Namely, a deteriorated state of battery 10 corresponding to each deterioration mode can highly accurately be estimated. Fourier transform is used for calculation of an impedance component for each frequency bandwidth.

Figure 6:
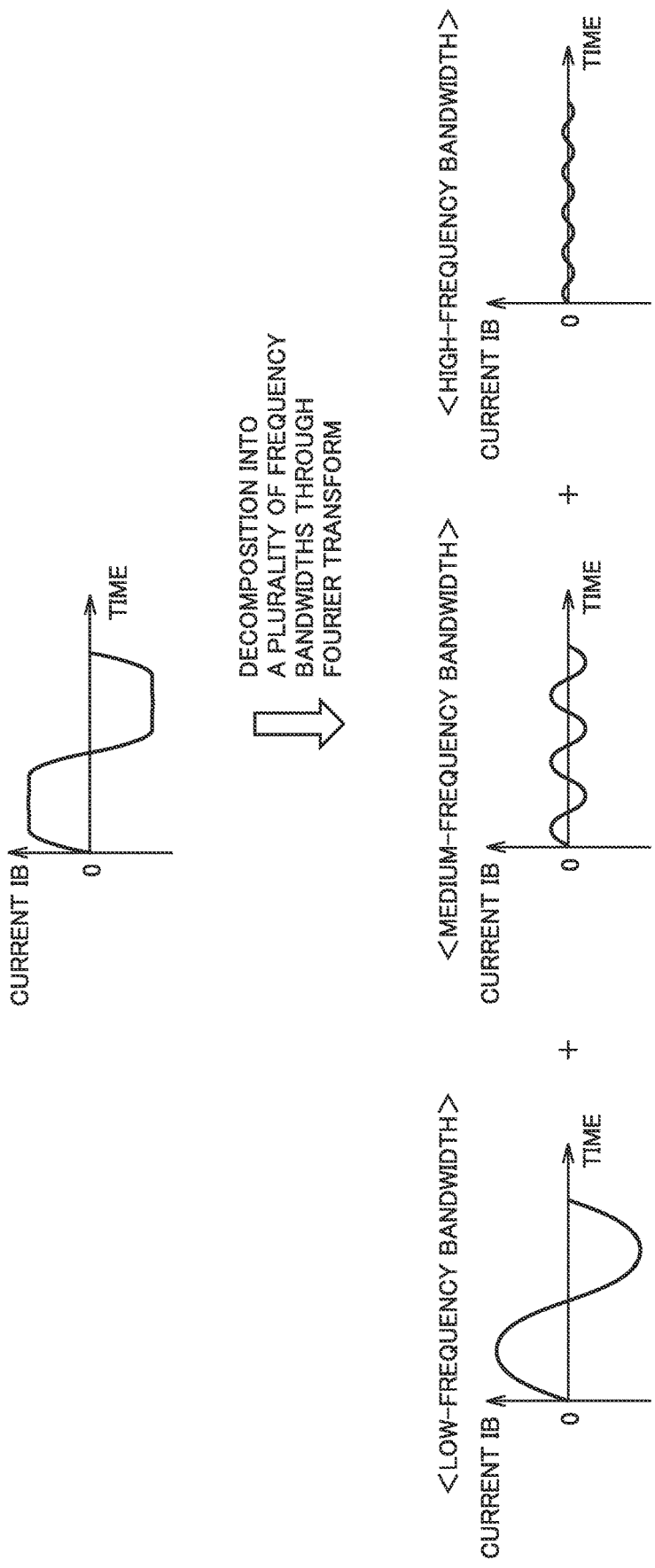
FIG. 6 is a conceptual diagram for illustrating a technique of calculating an impedance component for each frequency bandwidth through Fourier transform.

FIG. 6 is a conceptual diagram for illustrating a technique of calculating an impedance component for each frequency bandwidth through Fourier transform. As shown in FIG. 6, by subjecting current IB (and voltage VB) to Fourier transform, current IB can be decomposed into a low-frequency component, a medium-frequency component, and a high-frequency component. An impedance component can be calculated for each frequency bandwidth based on thus decomposed voltage VB and current IB.

An example in which an impedance component is calculated by subjecting voltage VB and current IB to fast Fourier transform (FFT) will be described below. An algorithm for Fourier transform is not limited to FFT, and it may be discrete Fourier transform (DFT).

In order to secure accuracy in Fourier transform, data (voltage VB and current IB) should be obtained for a certain period of time and stored in memory 100B of ECU 100 and then the data should be subjected to Fourier transform. A period during which data for Fourier transform is obtained is also denoted as a "data acquisition period." The data acquisition period corresponds to a "prescribed period" according to the present disclosure.

An impedance of battery 10 (an impedance component in each frequency bandwidth) may have dependency on a current, a temperature, and an SOC. Therefore, when any of current IB, temperature TB, and an SOC of battery 10 has excessively varied during a certain data acquisition period, an impedance may not highly accurately be calculated because Fourier transform is carried out at once in spite of difference in influence by dependency (dependency on a current, a temperature, or an SOC) between a certain period (a period before variation) and another period (a period after variation) during the data acquisition period.

Then, in the present embodiment, such a condition that none of current IB, temperature TB, and an SOC of battery 10 has significantly varied during the data acquisition period is imposed on data to be subjected to Fourier transform. A method of determining a deteriorated state of battery 10 in the present embodiment will be described below in detail.

<Determination of Deteriorated State of Battery>

Figure 7:
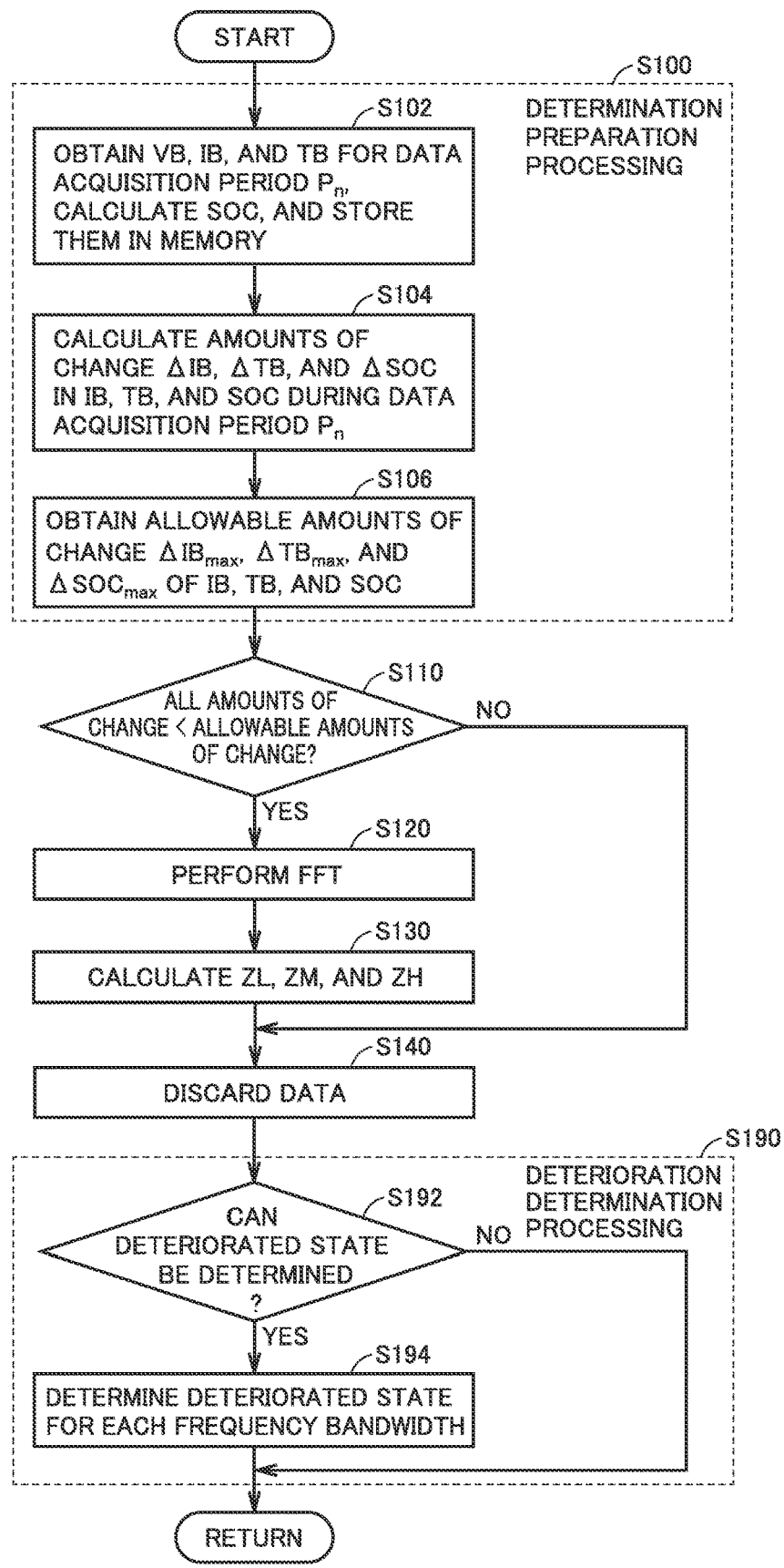
FIG. 7 is a flowchart showing a method of determining a deteriorated state of the battery in the first embodiment.

FIG. 7 is a flowchart showing a method of determining a deteriorated state of battery 10 in the first embodiment. A flowchart shown in each of FIG. 7 and FIGS. 12, 15, 17, and 24 which will be described later is executed by being invoked from a main routine each time a prescribed period elapses while vehicle 1 is running. Though each step (which is abbreviated as S) is basically performed by software processing by ECU 100, it may be performed by hardware processing by an electronic circuit fabricated in ECU 100.

Referring to FIG. 7, since processing in S102 to S106 is processing for preparation for determination as to whether or not to use data obtained from each sensor for calculation of an impedance, it may be denoted as "determination preparation processing" below (S100). More specifically, in S102, ECU 100 obtains voltage VB, current IB, and temperature TB with a predetermined sampling period from each sensor in monitoring unit 20 of battery 10 during a certain data acquisition period $P_n$ (n being a natural number). A length of data acquisition period $P_n$ can be set, for example, approximately to several seconds to several ten seconds. ECU 100 estimates an SOC of battery 10 with a prescribed period. ECU 100 has memory 100B temporarily store all data (obtained results of voltage VB, current IB, and temperature TB and a result of calculation of an SOC).

In S104, ECU 100 calculates an amount of change in current $\Delta IB$ representing an amount of change in current IB during data acquisition period $P_n$. ECU 100 calculates an amount of change in temperature $\Delta TB$ representing an amount of change in temperature TB during data acquisition period $P_n$. ECU 100 further calculates an amount of change in SOC $\Delta SOC$ representing an amount of change in SOC of battery 10 during data acquisition period $P_n$.

FIG. 8 is a diagram showing one example of change over time in data during data acquisition periods $P_n$ and $P_{n+1}$. As shown in FIG. 8, amount of change in current $\Delta IB$ can be calculated from an amount of change in current IB in consideration of both of a direction of charging and a direction of discharging of battery 10 during data acquisition period $P_n$. Amount of change in temperature $\Delta TB$ can be calculated based on a difference between a highest temperature (a largest value of temperature TB) and a lowest temperature (a smallest value of temperature TB) during data acquisition period $P_n$. Amount of change in SOC $\Delta SOC$ can be calculated based on a difference between a highest SOC and a lowest SOC during data acquisition period $P_n$.

Referring back to FIG. 7, in S106, ECU 100 obtains an allowable amount of change in current $\Delta IB_{max}$ by referring to a map MP1 stored in advance in a non-volatile manner in memory 100B. Allowable amount of change in current $\Delta IB_{max}$, is a parameter serving as a criterion as to whether or not to use data stored in memory 100B in S102 for calculation of an impedance and represents an allowable upper limit of amount of change in current $\Delta IB$. Similarly for amount of change in temperature $\Delta TB$ and amount of change in SOC $\Delta SOC$, ECU 100 further obtains an allowable amount of change in temperature $\Delta TB_{max}$ and an allowable amount of change in SOC $\Delta SOC_{max}$ by referring to map MP1.

FIG. 9 is a diagram showing one example of map MP1. As shown in FIG. 9, in map MP1, for each range of an average temperature $TB_{ave}$ of battery 10 during data acquisition period $P_n$, allowable amount of change in current $\Delta IB_{max}$, allowable amount of change in temperature $\Delta TB_{max}$, and allowable amount of change in SOC $\Delta SOC_{max}$ during data acquisition period $P_n$ are determined. It should be noted that a specific numeric value shown in FIG. 9 is merely by way of example for facilitating understanding of map MP1.

Map MP1 corresponds to "correspondence" according to the present disclosure. "Correspondence", however, is not limited to the map, but it may be a function or a conversion equation. Alternatively, instead of average temperature $TB_{ave}$, for example, a highest temperature or a lowest temperature may be employed, or a mode value of temperature TB may be employed. Though detailed description will not be repeated, instead of temperature TB (average temperature $TB_{ave}$, a highest temperature, a lowest temperature, or a mode temperature), current IB (for example, an average current, a highest current, or a lowest current) or an SOC (for example, an average SOC, a highest SOC, or a lowest SOC) may be employed. In map MP1, two or three of temperature TB, current IB, and an SOC may be used as being combined.

Referring back to FIG. 7, in S110, ECU 100 determines whether or not amount of change in current $\Delta IB$ is smaller than allowable amount of change in current $\Delta IB_{max}$. ECU 100 further determines whether or not amount of change in temperature $\Delta TB$ is smaller than allowable amount of change in temperature $\Delta TB_{max}$ and whether or not amount of change in SOC $\Delta SOC$ is smaller than allowable amount of change in SOC $\Delta SOC_{max}$.

When all of amount of change in current $\Delta IB$, amount of change in temperature $\Delta TB$, and amount of change in SOC $\Delta SOC$ are smaller than corresponding allowable amounts of change, that is, when a current condition of $\Delta IB<\Delta IB_{max}$ is satisfied, a temperature condition of $\Delta TB<\Delta TB_{max}$ is satisfied, and an SOC condition of $\Delta SOC<\Delta SOC_{max}$ is satisfied (YES in S110), ECU 100 subjects data (voltage VB and current IB) stored in memory 100B in S102 to FFT (S120). Then, ECU 100 calculates an impedance component in a frequency bandwidth (S130). The impedance component in each frequency bandwidth can be calculated based on a ratio (VB/IB) between voltage VB and current IB in that frequency bandwidth (see, for example, PTD 1 for a detailed equation for calculation of an impedance component).

FIG. 10 is a diagram showing one example of a result of calculation of the impedance component. In FIG. 10, the abscissa represents a frequency on a logarithmic scale. The low-frequency bandwidth is defined as a frequency bandwidth, for example, not lower than 0.01 Hz and lower than 0.1 Hz. The medium-frequency bandwidth is defined as a frequency bandwidth, for example, not lower than 1 Hz and lower than 10 Hz. The high-frequency bandwidth is defined as a frequency bandwidth, for example, not lower than 100 Hz and lower than 1 kHz. The ordinate in FIG. 10 represents an impedance.

As shown in FIG. 10, a large number of impedance components different in frequency are calculated in each frequency bandwidth. Therefore, ECU 100 determines a representative value of an impedance component among a large number of impedance components for each of the low-frequency bandwidth, the medium-frequency bandwidth, and the high-frequency bandwidth.

For example, when a maximum value of the impedance component is defined as the representative value, ECU 100 determines the maximum value of the impedance component in the low-frequency bandwidth as a low-frequency impedance component ZL. In addition, the ECU determines the maximum value of the impedance component in the medium-frequency bandwidth as a medium-frequency impedance component ZM, and determines the maximum value of the impedance component in the high-frequency bandwidth as a high-frequency impedance component ZH. Defining the maximum value as the representative value is by way of example and an average value of a large number of impedance components in each frequency bandwidth may be defined as the representative value.

In calculation of an impedance component, an error due to a factor below may be produced. Specifically, white noise may be superimposed on each of a signal from voltage sensor 21 and a signal from current sensor 22. In addition, timing of acquisition of a signal from voltage sensor 21 by ECU 100 and timing of acquisition of a signal from current sensor 22 do not completely match with each other and the timing may be off.

As measures for lessening influence by such noise, processing for averaging impedance components calculated from data obtained during a plurality of consecutive data acquisition periods for each frequency is preferably performed. For example, an average value of an impedance component at a certain frequency calculated from data obtained during data acquisition period $P_n$ and an impedance component at the same frequency calculated from data obtained during data acquisition period $P_{n+1}$ is calculated. By way of example, for a frequency of 0.01 Hz, an average value of impedance components during two data acquisition periods $P_n$ and $P_{n+1}$ is calculated. After the average value is thus calculated, the representative value above can be calculated (for example, processing for averaging a large number of impedance components different in frequency in each frequency bandwidth can be performed).

Periods of acquisition of data used for this averaging processing have been described as consecutive data acquisition periods. This is because the consecutive data acquisition periods are highly likely to be comparable in conditions of use of battery 10, that is, current IB, temperature TB, and an SOC. The data acquisition periods being consecutive, however, is not essential so long as data is obtained under comparable conditions of use (such a condition that differences in current IB, temperature TB, and SOC are all equal to or smaller than prescribed values). For example, data obtained during running on one day and data obtained during running on a next day may be used for averaging processing.

Referring back to FIG. 7, after an impedance component in each frequency bandwidth is calculated, ECU 100 discards (erases) data stored in memory 100B (S140).

In contrast, when any one of amount of change in current $\Delta IB$, amount of change in temperature $\Delta TB$, and amount of change in SOC $\Delta SOC$ is greater than a corresponding allowable amount of change in S110, that is, at least one relational expression of $\Delta IB \geq \Delta IB_{max}$, $\Delta TB \geq \Delta TB_{max}$, and $\Delta SOC \geq \Delta SOC_{max}$ is satisfied (NO in S110), ECU 100 skips processing in S120 and S130 and the process proceeds to S140 where data stored in memory 100B is discarded.

In S190, ECU 100 performs processing for determining a deteriorated state of battery 10 based on the impedance component in each frequency bandwidth calculated in S130 (S190). This processing is also referred to as "deterioration determination processing" below.

More specifically, ECU 100 determines in S192 whether or not a deteriorated state of battery 10 can be determined (S192). For example, when results of a plurality of times of calculation of impedance components are used for highly accurate estimation of a deteriorated state of battery 10, the deteriorated state of battery 10 can be determined after results of the necessary number of times of calculation are obtained. When the deteriorated state of battery 10 can be determined (YES in S192), ECU 100 determines the deteriorated state of battery 10 in each frequency bandwidth (S194). When the deteriorated state of battery 10 cannot be determined (NO in S192), the process returns to the main routine without ECU 100 determining the deteriorated state of battery 10 in each frequency bandwidth.

ECU 100 may further carry out control in accordance with the deteriorated state after it has determined the deteriorated state of battery 10. By way of example, for the impedance component in each frequency bandwidth, a first reference value and a second reference value greater than the first reference value are predetermined. When the impedance component is higher than the first reference value in any frequency bandwidth, ECU 100 determines that deterioration of battery 10 is proceeding (deterioration of battery 10 has proceeded to some extent). In this case, for example, ECU 100 can suppress charging and discharging of battery 10. Specifically, ECU 100 sets restricted upper limit values of charging and discharging power (a charging electric power control upper limit value and a discharging electric power control upper limit value) of battery 10 to be lower than in an example in which the impedance component is lower than the first reference value. Thus, further progress of deterioration of battery 10 can be suppressed or a rate of deterioration of battery 10 can be lowered.

When the impedance component is higher than the second reference value in any frequency bandwidth, ECU 100 determines that battery 10 has significantly deteriorated. Therefore, ECU 100 carries out control for promptly stopping charging and discharging of battery 10. For example, ECU 100 sets vehicle 1 to a fail-safe mode and notifies a user of vehicle 1 that vehicle 1 should be brought to a dealer or a service garage for appropriate inspection.

After deterioration determination processing is performed, a series of processing shown in FIG. 7 is performed every prescribed period. Consequently, similar processing is repeatedly performed also during data acquisition periods $P_{n+1}$, $P_{n+2}$, ... (see FIG. 8) after present data acquisition period $P_n$.

As set forth above, according to the first embodiment, with attention being paid to the fact that an impedance of battery 10 has dependency on a current, a temperature, and an SOC, an impedance is calculated when none of current IB, temperature TB, and an SOC of battery 10 has significantly varied during a data acquisition period. In other words, when at least one of current IB, temperature TB, and an SOC of battery 10 has varied by a larger amount than a corresponding allowable amount of change ($\Delta IB_{max}$, $\Delta TB_{max}$, and $\Delta SOC_{max}$) during a data acquisition period, data (voltage VB and current IB) obtained during the data acquisition period is not subjected to FFT and not used for calculation of an impedance. Since dependency on a current, a temperature, and an SOC can appropriately be reflected on a result of calculation of an impedance of battery 10, accuracy in estimation of a deteriorated state of battery 10 can be improved.

A configuration in which an impedance component of battery 10 is calculated by using an irregular current waveform (and voltage waveform) produced while vehicle 1 which is a hybrid vehicle is running has been described in the first embodiment. Though not shown, when vehicle 1 is a plug-in hybrid vehicle or an electric vehicle, that is, vehicle 1 is configured such that battery 10 can be charged with electric power supplied from a power supply provided outside the vehicle (an external power supply) (what is called an externally chargeable configuration), an impedance component may be calculated based on a waveform of a current supplied from the external power supply during external charging. With a current waveform (a sine wave, a rectangular wave, or a triangular wave) of which frequency bandwidth ranges from a low-frequency bandwidth to a high-frequency bandwidth instead of supply of electric power having a constant current waveform from the external power supply, an impedance component in each frequency bandwidth can be calculated.

When temperature TB is low (for example, below freezing), dependency on a current and an SOC may greatly affect rates of deterioration DL, DM and DH. Then, a result of calculation of an impedance may greatly vary with a slight error in current and SOC, and accuracy in calculation of an impedance may be low.

For example, when a heating apparatus (for example, a not-shown electrical heater) is provided in battery 10 of vehicle 1, temperature TB of battery 10 may be increased by turning on the heating apparatus before calculation of an impedance component. Alternatively, temperature TB of battery 10 may be increased by applying a ripple current to battery 10 to generate heat (generate Joule heat) in battery 10. Since influence on an impedance by dependency on a current and an SOC is thus lessened, accuracy in calculation of an impedance can be improved.

First Modification of First Embodiment

In order to calculate an impedance component in the high-frequency bandwidth, a period for sampling of data should be short. For example, in calculating an impedance component at a frequency of 1 kHz, the sampling period is set to 1 ms or shorter (preferably 0.5 ms or shorter). For calculation of an impedance component in the low-frequency bandwidth, data should be obtained (sampled) for a long period and stored in memory 100B. For example, in order to calculate an impedance component at a frequency of 10 mHz, data for at least one hundred seconds should be stored in memory 100B.

When calculation of both of an impedance component in the high-frequency bandwidth and an impedance component in the low-frequency bandwidth is required, for example, data for one hundred seconds or longer obtained with a sampling period not longer than 1 ms may be stored in memory 100B. In that case, however, memory 100B of a large capacity is required and cost for members may increase. In order to address such a problem, a configuration capable of achieving reduction in storage capacity of memory 100B will be described in a first modification of the first embodiment.

Figure 11A:
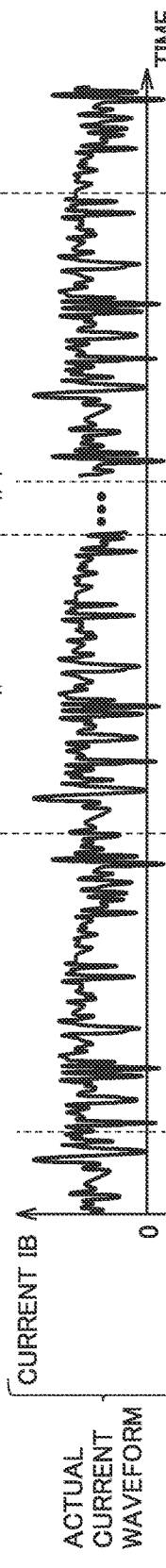
FIGS. 11A to 11C are conceptual diagrams for illustrating a technique of obtaining data in a first modification of the first embodiment.
Figure 11B:
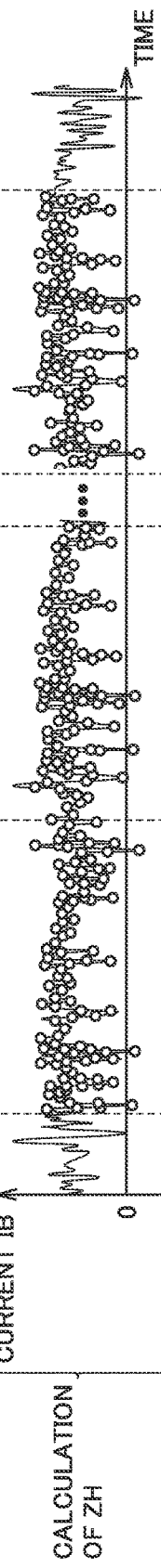
Figure 11C:
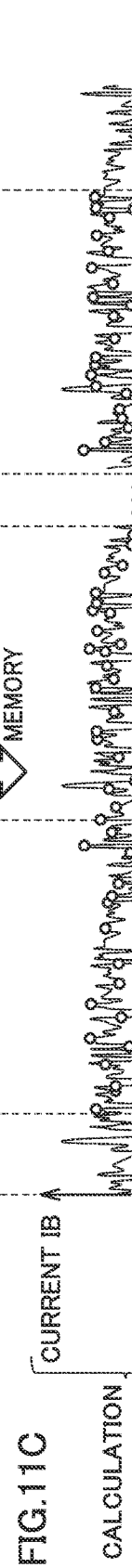

FIGS. 11A to 11C are conceptual diagrams for illustrating a technique of obtaining data in the first modification of the first embodiment. In FIGS. 11A to 11C, the abscissa represents elapsed time and the ordinate represents current IB of battery 10. An example in which current IB irregularly varies as shown in FIG. 11A while vehicle 1 is running will be described.

In order to calculate high-frequency impedance component ZH, sampling periods have to be dense whereas data does not have to be obtained for a long time. In contrast, for calculation of an impedance component in the low-frequency bandwidth, data should be obtained for a long period of time whereas sampling periods do not have to be dense. Therefore, in the present modification, as shown in FIG. 11B, data densely obtained at a high frequency during data acquisition period $P_n$ (results of measurement of voltage VB and current IB) is stored in memory 100B. At the time point of lapse of data acquisition period $P_n$, high-frequency impedance component ZH is calculated based on the data obtained during data acquisition period $P_n$.

Thereafter, processing for reducing an amount of data by discarding some of data obtained with dense sampling periods under a prescribed rule which is what is called data thinning processing is performed. Specifically, for data obtained with sampling periods of 1 ms, for example, processing for maintaining one piece of data while discarding subsequent 999 pieces of data is repeated. Thus, dense data of which sampling period is 1 ms can be converted to sparse data of which sampling period is one second. Then, the converted data (thinned data) is stored in memory 100B.

During subsequent data acquisition periods $P_{n+1}$ to $P_{n+k}$ (k being a natural number) as well, data thinning processing is performed similarly to the technique described above and the thinned data is stored in memory 100B (see FIG. 11C). Then, low-frequency impedance component ZL is calculated based on the thinned data stored in memory 100B during data acquisition periods $P_n$ to $P_{n+k}$. After low-frequency impedance component ZL is calculated, all data is discarded.

For example, as shown in FIG. 2, temperature TB and an SOC of battery 10 are less likely to irregularly vary than voltage VB and current IB. Therefore, a sampling period for temperature TB and an SOC can sufficiently be long.

An example in which medium-frequency impedance component ZM is calculated based on data of which sampling periods are dense (data before thinning processing) will be described below. Medium-frequency impedance component ZM, however, may be calculated based on data of which sampling periods are sparse (thinned data).

Figure 12:
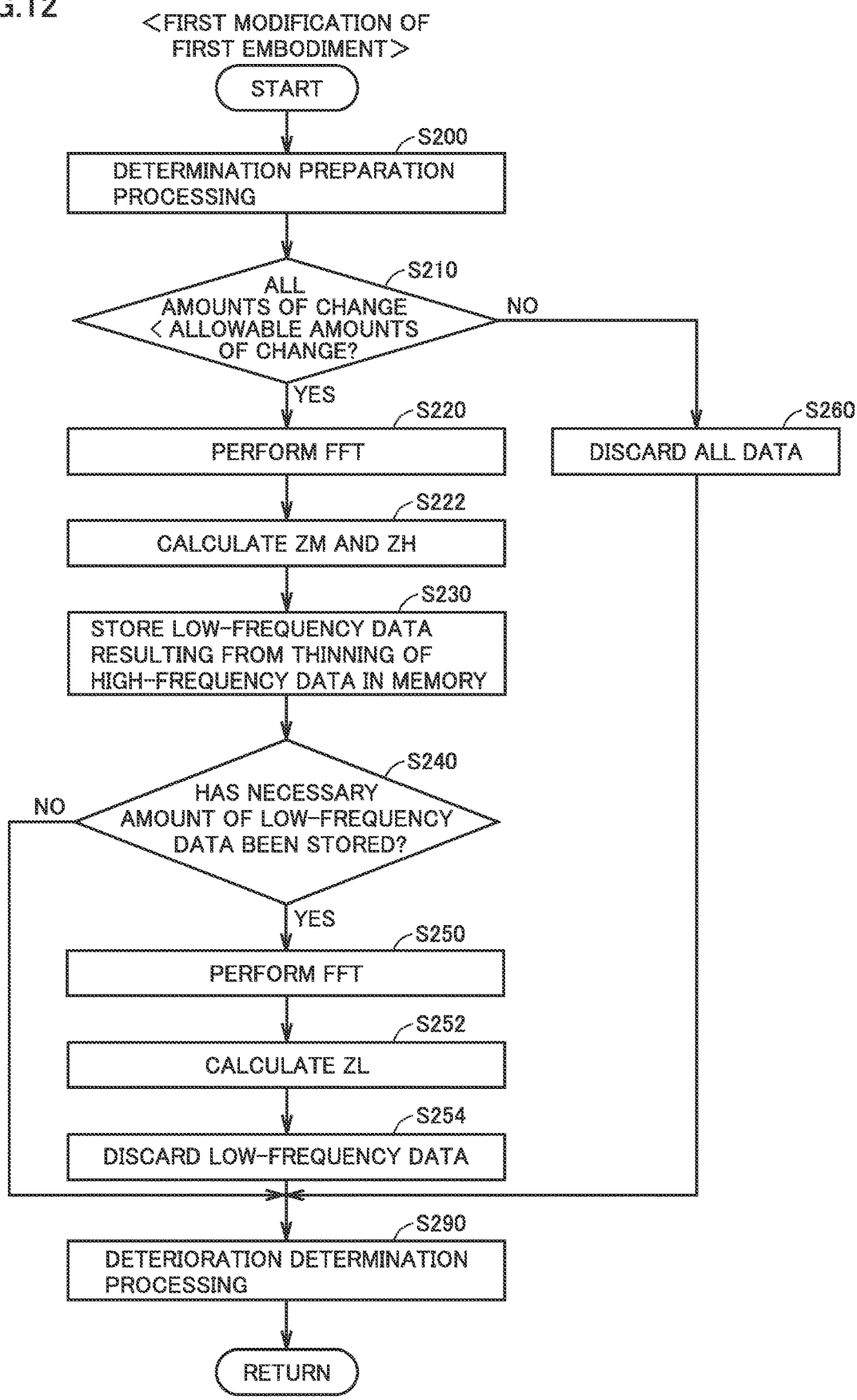
FIG. 12 is a flowchart showing a method of determining a deteriorated state of a battery 10 in the first modification of the first embodiment.

FIG. 12 is a flowchart showing a method of determining a deteriorated state of battery 10 in the first modification of the first embodiment. Referring to FIG. 12, this flowchart is different from the flowchart in the first embodiment (see FIG. 7) in including processing in S220 to S260 instead of processing in S120 to S140. Determination preparation processing in S200 is comparable to the determination preparation processing (processing in S100) in the first embodiment.

ECU 100 determines in S210, all amounts of change ($\Delta$IB, $\Delta$TB, and $\Delta$SOC) are smaller than corresponding allowable amounts of change ($\Delta IB_{max}$, $\Delta TB_{max}$, and $\Delta SOC_{max}$) based on a result in the determination preparation processing in S200. When at least one of amount of change in current $\Delta$IB, amount of change in temperature $\Delta$TB, and amount of change in SOC $\Delta$SOC is equal to or greater than a corresponding allowable amount of change (NO in S210), ECU 100 discards data (obtained results of voltage VB, current IB, and temperature TB and a result of calculation of an SOC) stored in memory 100B in the determination preparation processing without carrying out FFT (S260). Thereafter, the process proceeds to S290 and deterioration determination processing is performed. Deterioration determination processing (processing in S290) is comparable to the deterioration determination processing (processing in S190) in the first embodiment.

When all of amount of change in current $\Delta$IB, amount of change in temperature $\Delta$TB, and amount of change in SOC $\Delta$SOC are smaller than the corresponding allowable amounts of change, that is, relational expressions of $\Delta IB<\Delta IB_{max}$, $\Delta TB<\Delta TBmax$, and $\Delta SOC<\Delta SOCmax$ are satisfied (YES in S210), ECU 100 subjects data stored in memory 100B in the determination preparation processing to FFT (S220). ECU 100 further calculates medium-frequency impedance component ZM and high-frequency impedance component ZH (S222).

In S230, ECU 100 performs processing for thinning data obtained with sampling periods at a high frequency (which is also referred to as "high-frequency data"). Then, ECU 100 has memory 100B store thinned data with sampling periods at a low frequency (which is also referred to as "low-frequency data"). Since this processing has been described in detail with reference to FIGS. 11A to 11C, description thereof will not be repeated.

ECU 100 determines in S240 whether or not a necessary amount of low-frequency data has been stored in memory 100B. When a necessary amount of low-frequency data has been stored, for example, when low-frequency data during data acquisition periods $P_n$ to $P_{n+k}$ has been stored in the example shown in FIGS. 11A to 11C (YES in S240), ECU 100 subjects the low-frequency data to FFT (S250). ECU 100 further calculates low-frequency impedance component ZL (S252). After impedance component ZL is calculated, ECU 100 discards the low-frequency data stored in memory 100B (S254).

When a necessary amount of low-frequency data has not been stored in memory 100B in S240 (NO in S240), ECU 100 skips processing in S250 to S256. Processing for thinning high-frequency data (processing in S230) is repeatedly performed during a subsequent data acquisition period until the low-frequency data reaches a necessary amount.

As set forth above, according to the first modification of the first embodiment, as in the first embodiment, when at least one of current IB, temperature TB, and an SOC of battery 10 has varied by a larger amount than a corresponding allowable amount of change during a data acquisition period, data obtained during the data acquisition period is not subjected to FFT and not used for calculation of an impedance. Thus, accuracy in calculation of an impedance is improved and consequently, accuracy in estimation of a deteriorated state of battery 10 can be improved.

According to the first modification of the first embodiment, data obtained with dense sampling periods for calculation of high-frequency impedance component ZH (high-frequency data) is thinned and thinned data (low-frequency data) is stored in memory 100B. Then, low-frequency impedance component ZL is calculated based on low-frequency data stored in memory 100B over a plurality of data acquisition periods. An amount of data stored in memory 100B for calculation of low-frequency impedance component ZL is thus reduced. Therefore, a storage capacity of memory 100B can be reduced and increase in cost for members can be suppressed.

Second Modification of First Embodiment

It is not essential to always calculate impedance components in all frequency bandwidths of the low-frequency bandwidth, the medium-frequency bandwidth, and the high-frequency bandwidth. A configuration in which a period during which an impedance component in some frequency bandwidth is not calculated is provided will be described in a second modification of the first embodiment.

Figure 13A:
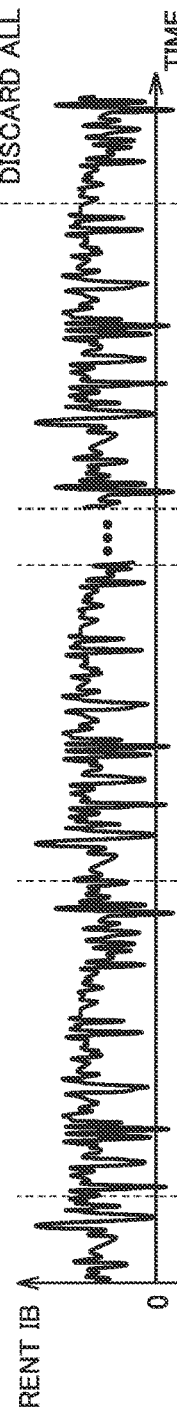
FIGS. 13A to 13C are conceptual diagrams for illustrating a technique of obtaining data in a second modification of the first embodiment.
Figure 13B:
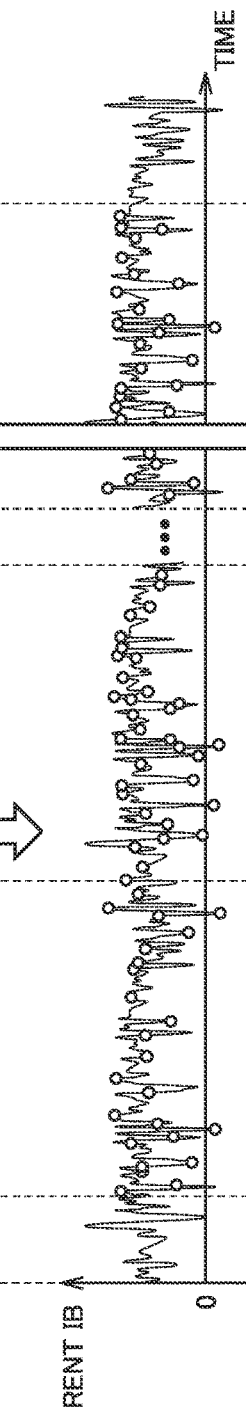
Figure 13C:
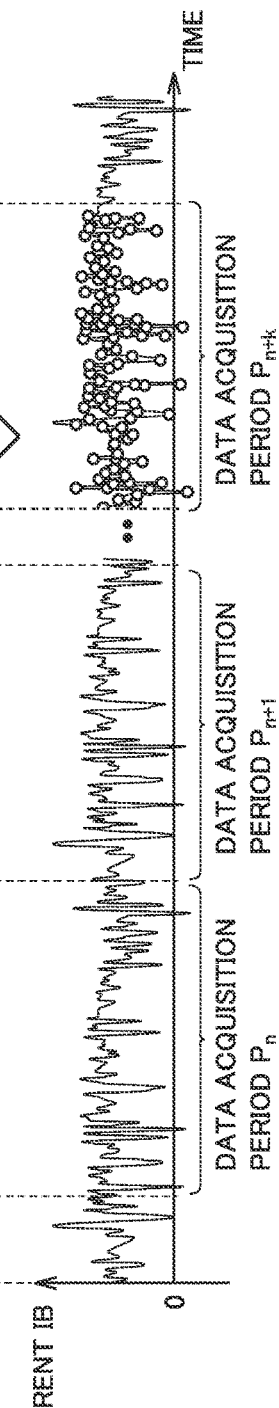

FIGS. 13A to 13C are conceptual diagrams for illustrating a technique of obtaining data in the second modification of the first embodiment. Referring to FIG. 13A, in the second modification, low-frequency impedance component ZL is steadily calculated. During a data acquisition period in which only low-frequency impedance component ZL is calculated, a relatively long (sparse) sampling period is set.

High-frequency impedance component ZH is calculated, for example, only once each time m (m being a natural number not smaller than two) data acquisition periods elapse. As a time period required for variation in high-frequency impedance component ZH to take place is longer, a constant m can be set to be greater. A data acquisition period ($P_{n+k}$ in FIG. 13C) in which high-frequency impedance component ZH is calculated is set to be short (dense) in sampling period than a data acquisition period ($P_n$ and $P_{n+1}$ in FIG. 13) in which only low-frequency impedance component ZL is calculated.

Though not shown, medium-frequency impedance component ZM may steadily be calculated similarly to low-frequency impedance component ZL and may be calculated non-steadily (periodically) similarly to high-frequency impedance component ZH.

As set forth above, according to the second modification of the first embodiment, high-frequency impedance component ZH is calculated only every m data acquisition periods. Since it is thus unnecessary to always set a more frequent sampling period in order to calculate high-frequency impedance component ZH, an amount of data stored in memory 100B is reduced. Therefore, a storage capacity of memory 100B can be reduced and increase in cost for members can be suppressed.

Second Embodiment

Though current IB while vehicle 1 is running is basically irregular, a status of running of vehicle 1 may be reflected on a waveform of the current. A configuration in which a sampling period of data is switched in accordance with a status of running of vehicle 1 will be described in a second embodiment. Since the overall configuration of the vehicle and the configuration of the secondary battery system in the second embodiment are comparable to the configurations in the first embodiment (see FIGS. 1 and 2), detailed description will not be repeated.

Figure 14:
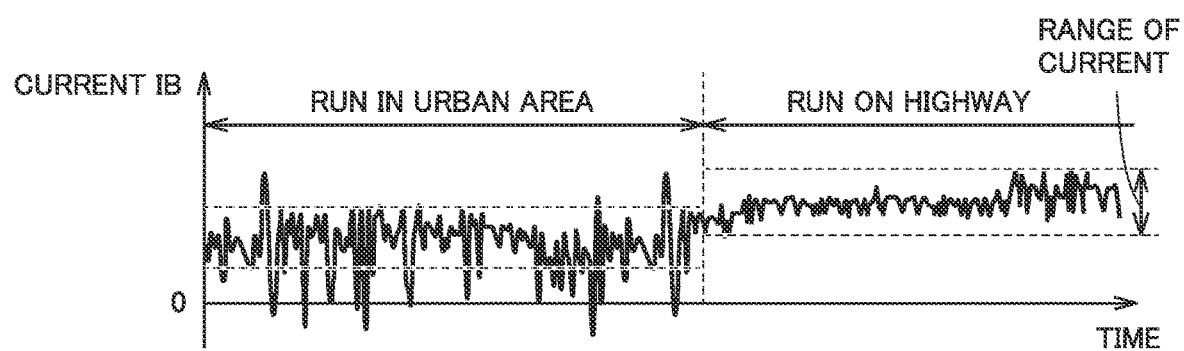
FIG. 14 is a diagram showing one example of change over time in current of the battery while a vehicle 1 is running.

FIG. 14 is a diagram showing one example of change over time in current IB of battery 10 while vehicle 1 is running. In FIG. 14, the abscissa represents elapsed time and the ordinate represents current IB.

Referring to FIG. 14, while vehicle 1 is running, for example, in an urban area, variation in a direction of charging (a negative direction) and variation in a direction of discharging (a positive direction) of current IB are often repeated in a short period of time. Since a waveform of the current when switching between charging and discharging of battery 10 is often thus includes many high-frequency components, the waveform is suitable for calculation of high-frequency impedance component ZH.

In contrast, running of vehicle 1, for example, on a highway is characterized in that switching between charging and discharging of battery 10 is less often than in running of vehicle 1 in an urban area and charging and discharging within a relatively narrow range of currents tends to continue for a long period. Since the waveform of the current at this time includes many low-frequency components, the waveform is suitable for calculation of low-frequency impedance component ZL.

Figure 15:
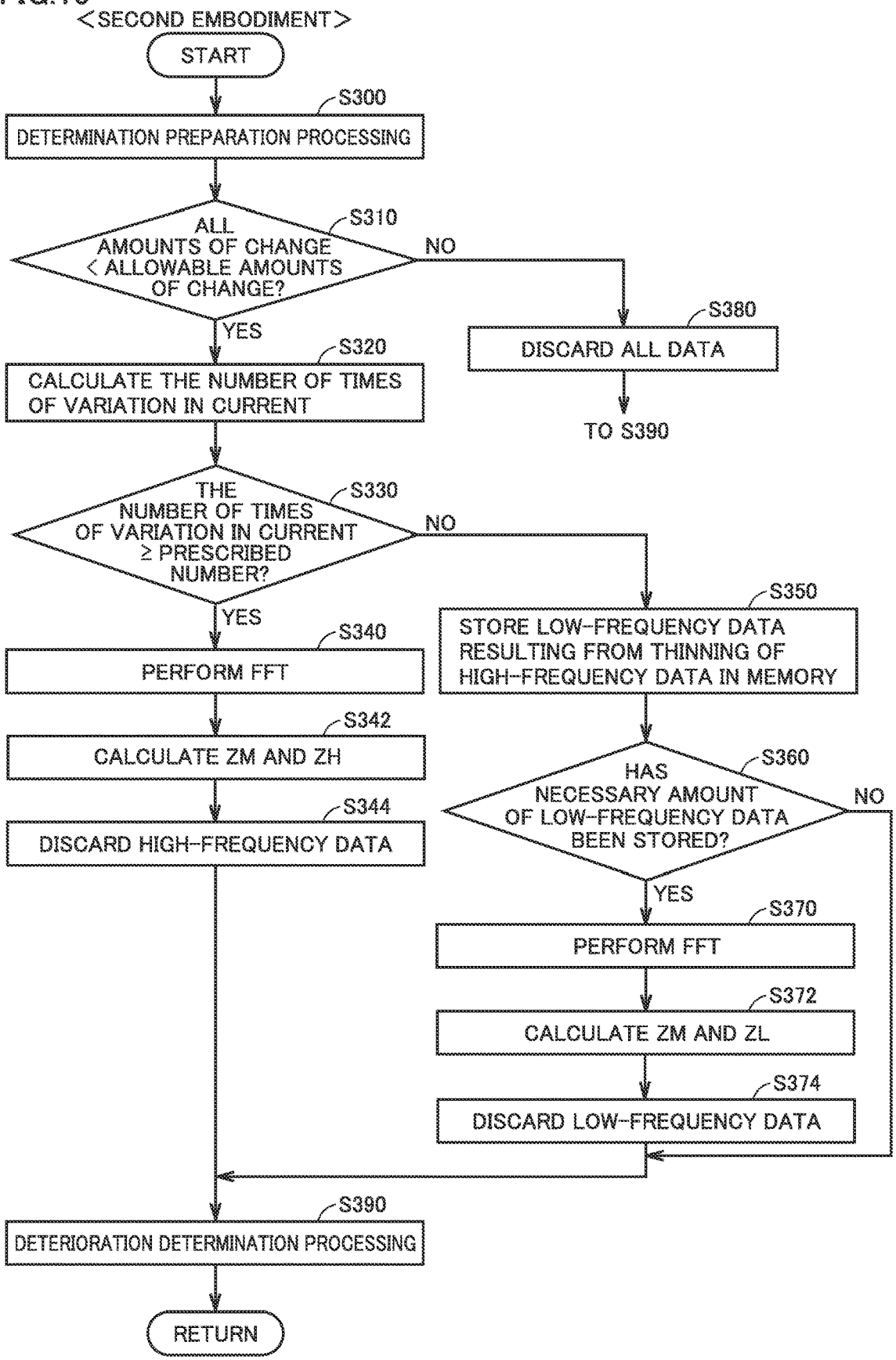
FIG. 15 is a flowchart showing a method of determining a deteriorated state of the battery in a second embodiment.

FIG. 15 is a flowchart showing a method of determining a deteriorated state of battery 10 in the second embodiment. Referring to FIG. 15, this flowchart is different from the flowchart (see FIG. 12) in the first modification of the first embodiment in including processing in S320 to S374 instead of processing in S220 to S254. Processing in S300, S310, S380, and S390 is comparable to the processing in S200, S210, S260, and S290 in the first modification of the first embodiment.

When all of amount of change in current $\Delta IB$, amount of change in temperature $\Delta TB$, and amount of change in SOC $\Delta SOC$ are smaller than corresponding allowable amounts of change in S310 (YES in S310), the process proceeds to S320 and ECU 100 calculates the number of times of variation in current during data acquisition period $P_n$. The number of times of variation in current refers to the number of times that current IB is out of a prescribed range of currents (see FIG. 14).

When the number of times of variation in current is equal to or greater than a prescribed number (YES in S330), ECU 100 determines that vehicle 1 is running in an urban area and a waveform of the current suitable for calculation of high-frequency impedance component ZH is obtained and subjects data (obtained results of voltage VB, current IB, and temperature TB and a result of calculation of an SOC) stored in memory 100B to FFT (S340). ECU 100 further calculates medium-frequency impedance component ZM and high-frequency impedance component ZH. Thereafter, ECU 100 discards high-frequency data stored in memory 100B (S344).

In contrast, when the number of times of variation in current is smaller than the prescribed number in S330 (NO in S330), ECU 100 determines that vehicle 1 is running on a highway and a waveform of the current suitable for calculation of low-frequency impedance component ZL is obtained and performs processing for thinning high-frequency data (S350). This thinning processing is comparable to the processing described in the first modification of the first embodiment (see FIGS. 11A to 11C). ECU 100 has memory 100B store thinned low-frequency data. Processing in S360 to S374 below is comparable to the processing in S240 to S254 in the first modification of the first embodiment. Therefore, detailed description will not be repeated.

As set forth above, according to the second embodiment, accuracy in estimation of a deteriorated state of battery 10 can be improved as in the first embodiment (and the first and second modifications) owing to determination preparation processing and subsequent processing for comparison with an allowable amount of change (processing in S300, S310, and S380). Furthermore, according to the second embodiment, for calculation of which of high-frequency impedance component ZH and low-frequency impedance component ZL the obtained waveform of current is suitable is determined based on variation in current IB (the number of times of variation in current). Since accuracy in calculation of an impedance component is thus improved, accuracy in estimation of a deteriorated state of battery 10 can further be improved.

An example in which whether a current position of vehicle 1 is in an urban area or on a highway is determined based on the number of times of variation in current has been described in the second embodiment. When a car navigation system (not shown) is mounted on vehicle 1, however, a current position of vehicle 1 may be located by using map data and a global pointing system (GPS) function of the car navigation system. Alternatively, a current position of vehicle 1 may be located by communicating with another vehicle (or facility) around vehicle 1.

Third Embodiment

A configuration in which a frequency of calculation of an impedance of battery 10 is set for each frequency bandwidth will be described in a third embodiment. A frequency of calculation of an impedance means the number of times of calculation of an impedance (an impedance component in a certain frequency bandwidth) during a prescribed period. Since the overall configuration of the vehicle and the configuration of the secondary battery system in the third embodiment are comparable to the configurations in the first embodiment (see FIGS. 1 and 2), detailed description will not be repeated.

Figure 16:
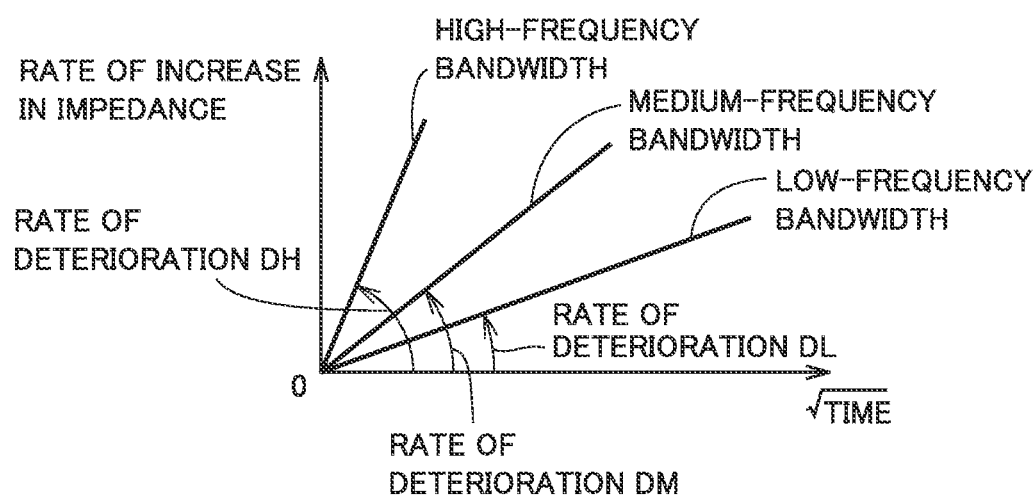
FIG. 16 is a diagram for illustrating a technique of setting a frequency of calculation of an impedance component in each frequency bandwidth in a third embodiment.
Figure 18:
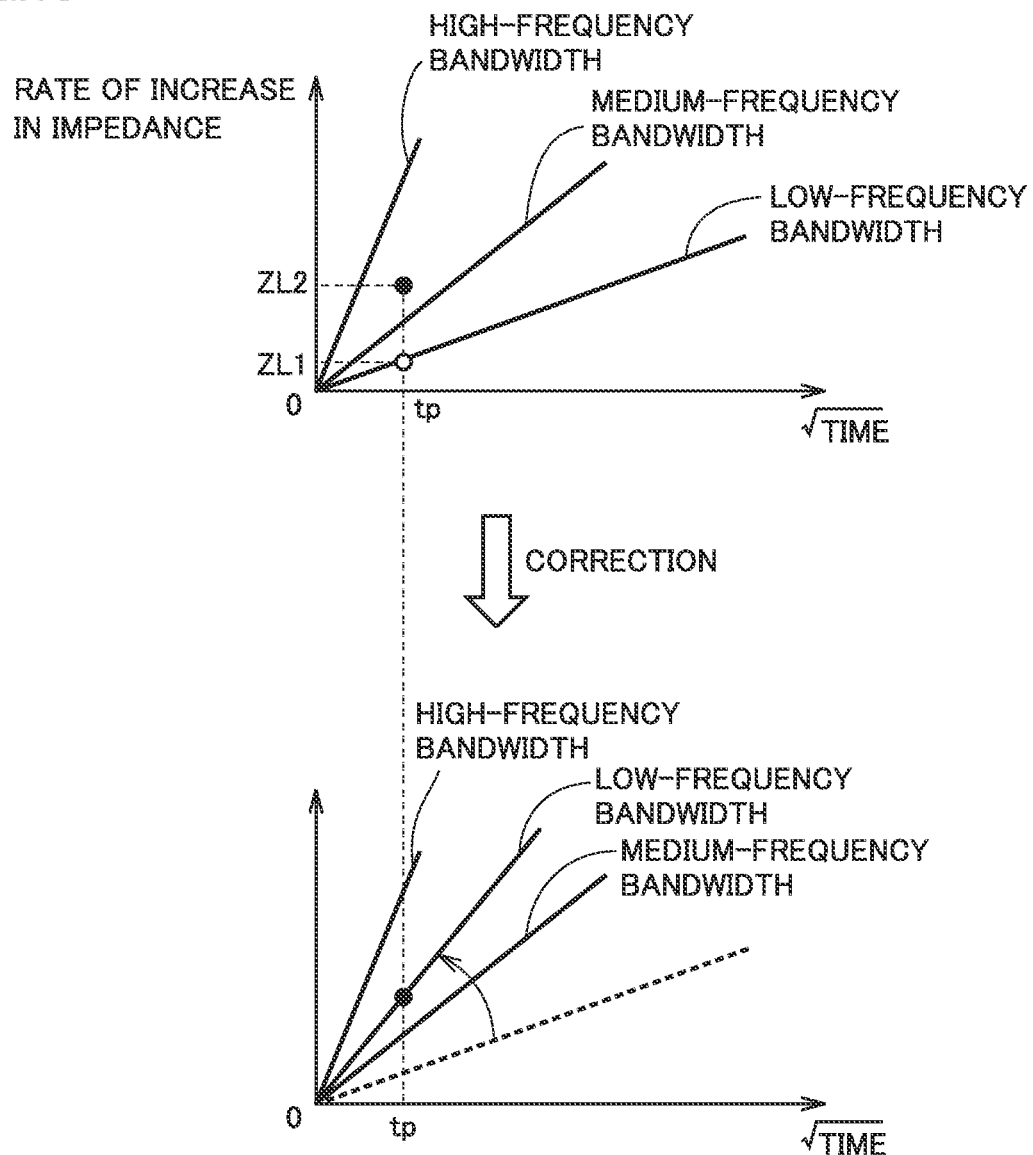
FIG. 18 is a diagram for illustrating a technique of correcting a rate of deterioration.

FIG. 16 is a diagram for illustrating a technique of setting a frequency of calculation of an impedance component in each frequency bandwidth in the third embodiment. In FIG. 16 and FIG. 18 which will be described later, the abscissa represents a square root of elapsed time. The ordinate represents a rate of increase in impedance components ZL, ZM, and ZH (a rate of increase in impedance). The rate of increase in impedance means a ratio of an impedance component (at a certain time point) to an impedance component in an initial state.

Referring to FIG. 16, with the abscissa representing a square root of elapsed time, a rate of increase in impedance is shown with a straight line. Representation of a square root of elapsed time on the abscissa, however, is merely by way of example, and the abscissa is set as appropriate such that a rate of increase in impedance is shown with a straight line when it is plotted on a graph.

When linear relation as shown in FIG. 16 is satisfied, an inclination of a straight line representing a rate of increase in low-frequency impedance component ZL is defined as a "rate of deterioration" of battery 10 in the low-frequency bandwidth and denoted as rate of deterioration DL. Similarly, an inclination of a straight line showing a rate of increase in medium-frequency impedance component ZM is denoted as rate of deterioration DM of battery 10 in the medium-frequency bandwidth. An inclination of a straight line showing a rate of increase in high-frequency impedance component ZH is denoted as rate of deterioration DH of battery 10 in the high-frequency bandwidth.

Each of rates of deterioration DL, DM, and DH is found through measurement in advance and stored in memory 100B. In general, a degree of progress of deterioration of a battery is different depending on a condition of use (an environment of use) of the battery. For example, deterioration of battery is more likely to proceed when a vehicle runs in an area at a high temperature than when the vehicle runs in an area of a mild climate or a cold area. Therefore, in the third embodiment, correspondence between a condition of use of battery 10 (temperature TB, current IB, and an SOC) and a rate of deterioration is measured for each of rates of deterioration DL, DM, and DH. A map (not shown) showing dependency of a rate of deterioration on a temperature, a current, and an SOC is created based on results of measurement of correspondence and stored in memory 100B. A frequency of calculation of an impedance component can thus be set for each frequency bandwidth by using an appropriate rate of deterioration in accordance with a condition of use of vehicle 1.

In the third embodiment, a frequency of calculation of low-frequency impedance component ZL is denoted as FL, a frequency of calculation of medium-frequency impedance component ZM is denoted as FM, and a frequency of calculation of high-frequency impedance component ZH is denoted as FH. Each of frequencies of calculation FL, FM, and FH is set to be higher as a rate of deterioration is higher.

More specifically, frequencies of calculation FL, FM, and FH can be set to be in proportion to rates of deterioration DL, DM, and DH, respectively. In this case, by using a prescribed coefficient α, frequency of calculation FL can be expressed as FL=α×DL/(DL+DM+DH), frequency of calculation FM can be expressed as FM=α×DM/(DL+DM+DH), and frequency of calculation FH can be expressed as FH=α×DH/(DL+DM+DH). Since relation of a rate of deterioration of DL<DM<DH is satisfied in the example shown in FIG. 16, relation of FL<FM<FH is satisfied among frequencies of calculation FL, FM, and FH. For confirmation purpose, relation of DL<DM<DH is merely by way of example.

Figure 17:
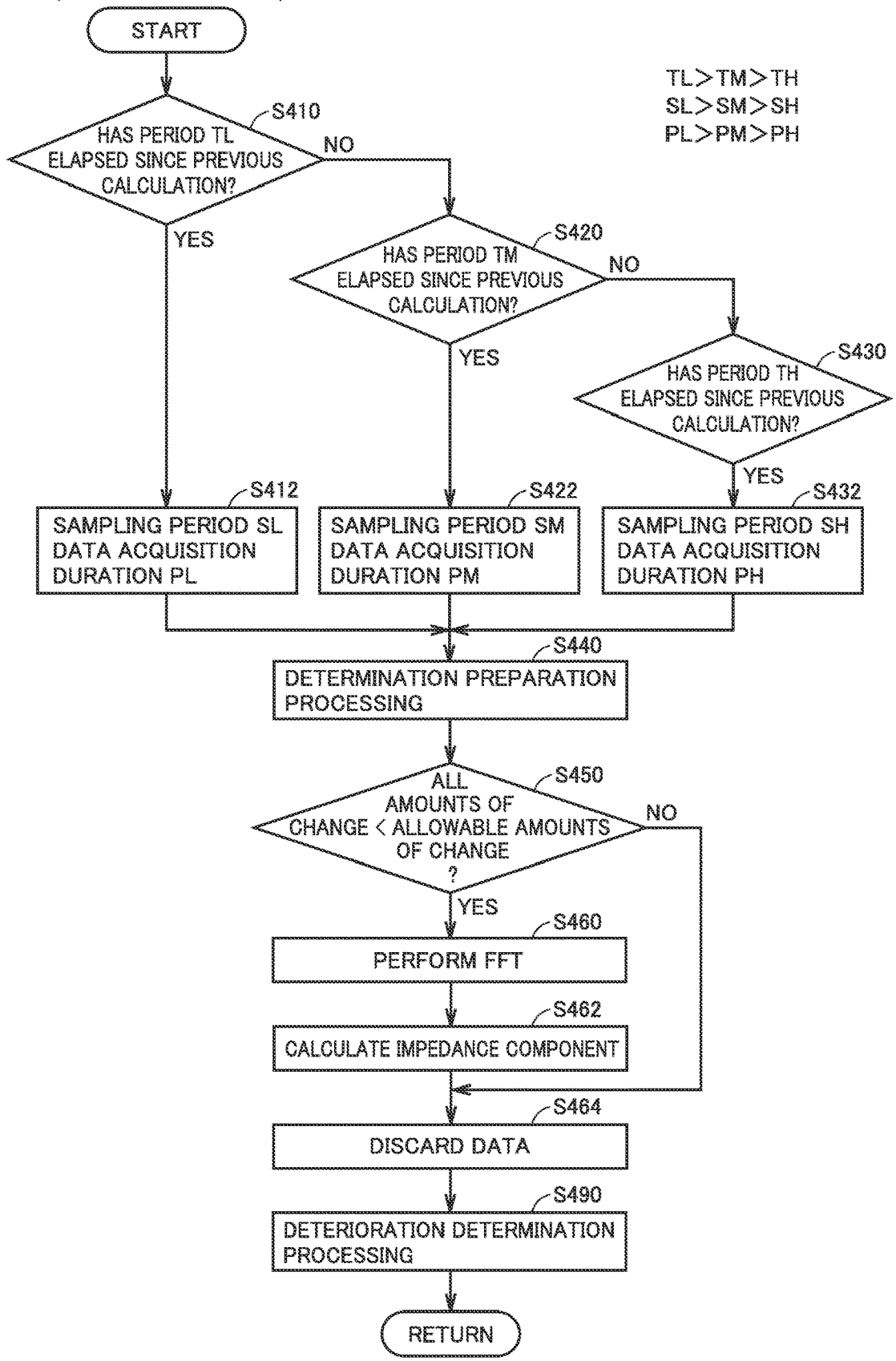
FIG. 17 is a flowchart showing a method of determining a deteriorated state of the battery in the third embodiment.

FIG. 17 is a flowchart showing a method of determining a deteriorated state of battery 10 in the third embodiment. Referring to FIG. 17, ECU 100 determines in S410 whether or not a prescribed period TL has elapsed since previous calculation of low-frequency impedance component ZL.

When period TL has elapsed since previous calculation of low-frequency impedance component ZL (YES in S410), ECU 100 sets a sampling period SL and sets a length of a data acquisition period (data acquisition duration) PL (S412).

When period TL has not elapsed since previous calculation of low-frequency impedance component ZL (NO in S410), the process proceeds to S420 and ECU 100 determines whether or not a prescribed period TM has elapsed since previous calculation of medium-frequency impedance component ZM. When period TM has elapsed since previous calculation of medium-frequency impedance component ZM (YES in S420), ECU 100 sets a sampling period SM (SM<SL) and sets a data acquisition duration PM (PM<PL) (S422).

When period TM has not elapsed since previous calculation of medium-frequency impedance component ZM (NO in S420), the process proceeds to S430 and ECU 100 determines whether or not a prescribed period TH has elapsed since previous calculation of high-frequency impedance component ZH. When period TH has elapsed since previous calculation of high-frequency impedance component ZH (YES in S430), ECU 100 sets a sampling period SH (SH<SM<SL) and sets a data acquisition duration PH (PH<PM<PL) (S432).

When processing in any of S412, S422, and S432 ends, the process proceeds to S440 and ECU 300 performs determination preparation processing. The determination preparation processing is basically comparable to the determination preparation processing (processing in S100 in FIG. 7) in the first embodiment. More specifically, ECU 100 obtains voltage VB, current IB, and temperature TB with set sampling periods (any of SL, SM, and SH) for the data acquisition duration (any of PL, PM, and PH) set in the processing in S412, S422, and S432. ECU 100 estimates an SOC of battery 10 at prescribed intervals. Then, ECU 100 has memory 100B temporarily store all data (obtained results of voltage VB, current IB, and temperature TB and a result of calculation of an SOC). ECU 100 further calculates amount of change in current ΔIB, amount of change in temperature ΔTB, and amount of change in SOC ΔSOC during the data acquisition period. Then, ECU 100 obtains allowable amount of change in current $\Delta IB_{max}$, allowable amount of change in temperature $\Delta TB_{max}$, and allowable amount of change in SOC $\Delta SOC_{max}$ by referring to map MP1 (see FIG. 9).

When all of amount of change in current ΔIB, amount of change in temperature ΔTB, and amount of change in SOC ΔSOC are smaller than corresponding allowable amounts of change ($\Delta IB_{max}$, $\Delta TB_{max}$, and $\Delta SOC_{max}$) (YES in S450), ECU 100 carries out FFT in S460. ECU 100 further calculates an impedance component in a frequency bandwidth selected in S410 to S430 (S462). More specifically, when the low-frequency bandwidth is selected in S410 and processing in S412 is performed, ECU 100 calculates low-frequency impedance component ZL. When the medium-frequency bandwidth is selected in S420 and processing in S422 is performed, ECU 100 calculates medium-frequency impedance component ZM. When the high-frequency bandwidth is selected in S430 and processing in S432 is performed, ECU 100 calculates high-frequency impedance component ZH.

Thereafter, ECU 100 discards data stored in memory 100B (S464). Then, ECU 100 performs deterioration determination processing for determining a deteriorated state of battery 10 (S490). Since deterioration determination processing is comparable to the deterioration determination processing (processing in S190) in the first embodiment, detailed description will not be repeated.

Though FIG. 16 illustrates an example in which a value found based on a result of measurement in advance is used for each of rates of deterioration DL, DM, and DH, it is not essential that rates of deterioration DL, DM, and DH have fixed values. For example, depending on tendency of driving by a user of vehicle 1, a difference may be produced between an actually calculated value of each of rates of deterioration DL, DM, and DH of vehicle 1 and a set value (a value found in measurement in advance). In such a case, rates of deterioration DL, DM, an DH can be corrected as appropriate as will be described below.

FIG. 18 is a diagram for illustrating a technique of correcting rates of deterioration DH, DM, and DL. Referring to FIG. 18, an example in which, at certain time tp, a set value of low-frequency impedance component ZL is ZL1 whereas an actually calculated value thereof is ZL2 is described. When a difference (ZL2-ZL1) of low-frequency impedance component ZL is greater than a prescribed value, an inclination of a straight line (rate of deterioration DL) representing a rate of increase in low-frequency impedance component ZL is corrected based on the actually calculated value.

Though correction based on an absolute difference (ZL2-ZL1) of low-frequency impedance component ZL is described, correction based on a relative difference (ZL2-ZL1)/ZL2 between the actually calculated value and the set value can also be made.

As set forth above, according to the third embodiment, a frequency of calculation of an impedance component is set to be higher for each frequency bandwidth as a rate of deterioration is higher. As a rate of increase in impedance component is higher, an impedance component is calculated at a higher frequency.

Thus, for example, even when an impedance component abruptly increases, such increase can promptly be detected. Consequently, control for suppressing excessive increase in impedance component can be carried out at appropriate timing.

From an opposite point of view, when a rate of deterioration is relatively low, abrupt increase in impedance component is less likely and hence it is not necessary to calculate an impedance component at a high frequency. Therefore, according to the third embodiment, when a rate of deterioration is relatively low, a frequency of calculation of an impedance component is set to be low. Thus, operation loads imposed on ECU 100 can be lessened and computation resources for ECU 100 can effectively be used.

Modification of Third Embodiment

An example in which an impedance component in each frequency bandwidth is calculated for battery 10 has been described in the third embodiment, which is, however, for the purpose of facilitating description. Battery 10 includes a plurality of cells 11 as shown in FIG. 2. In general, the number of cells included in a secondary battery system mounted on a vehicle ranges from several ten to several hundred. Therefore, calculation of impedances of all cells 11 in parallel as described in the third embodiment is difficult in view of computation resources or cost for ECU 100. Then, in a modification of the third embodiment, for example, impedance components are successively calculated for each of blocks 101 to 10M.

Figure 19:
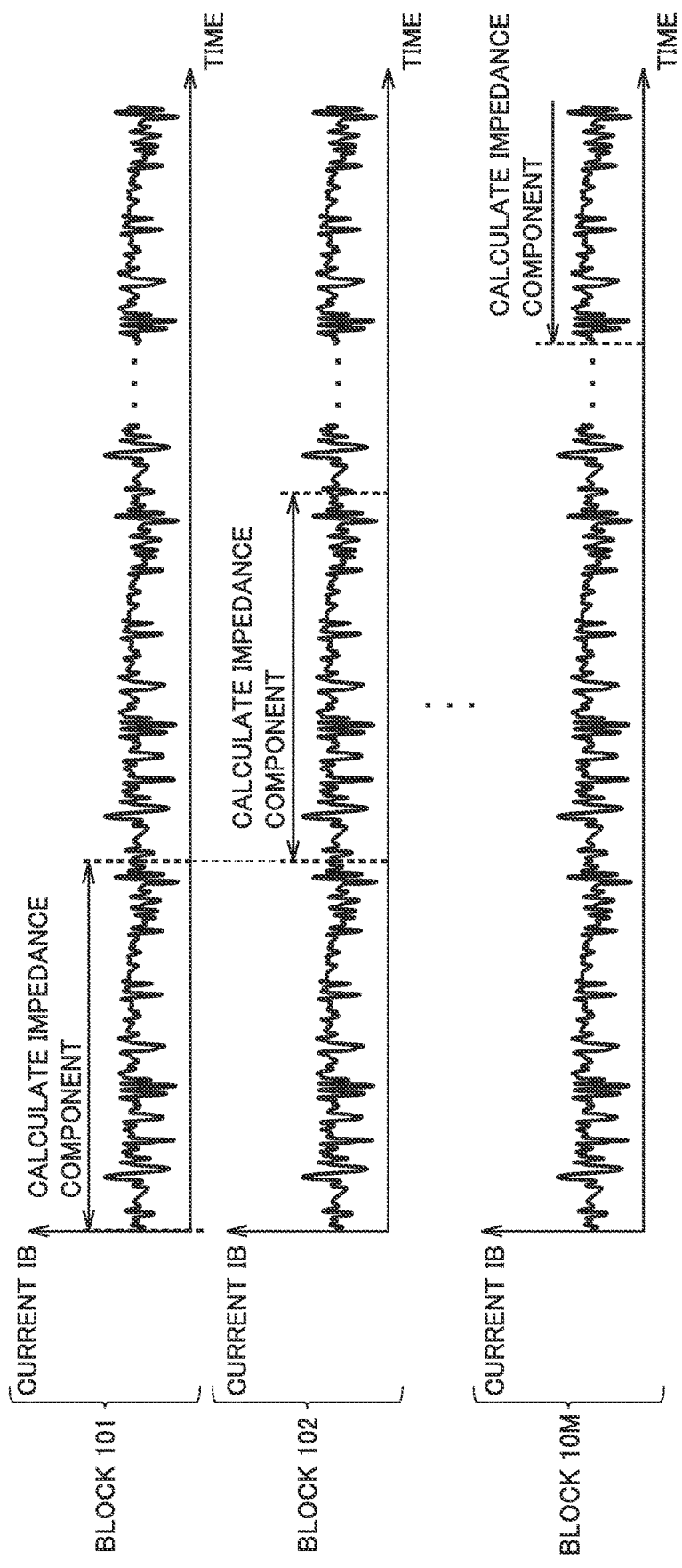
FIG. 19 is a conceptual diagram for illustrating a technique of obtaining data in a modification of the third embodiment.

FIG. 19 is a conceptual diagram for illustrating a technique of obtaining data in the modification of the third embodiment. Referring to FIG. 19, in the modification of the third embodiment, initially, an impedance component in each frequency bandwidth is calculated for block 101. In succession, an impedance component in each frequency bandwidth is calculated for block 102. Thereafter, an impedance component in each frequency bandwidth is calculated similarly for remaining blocks 103 to 10M. Though not shown, when calculation of an impedance component for block 10M ends, an impedance component for block 101 is again calculated.

Figure 20:
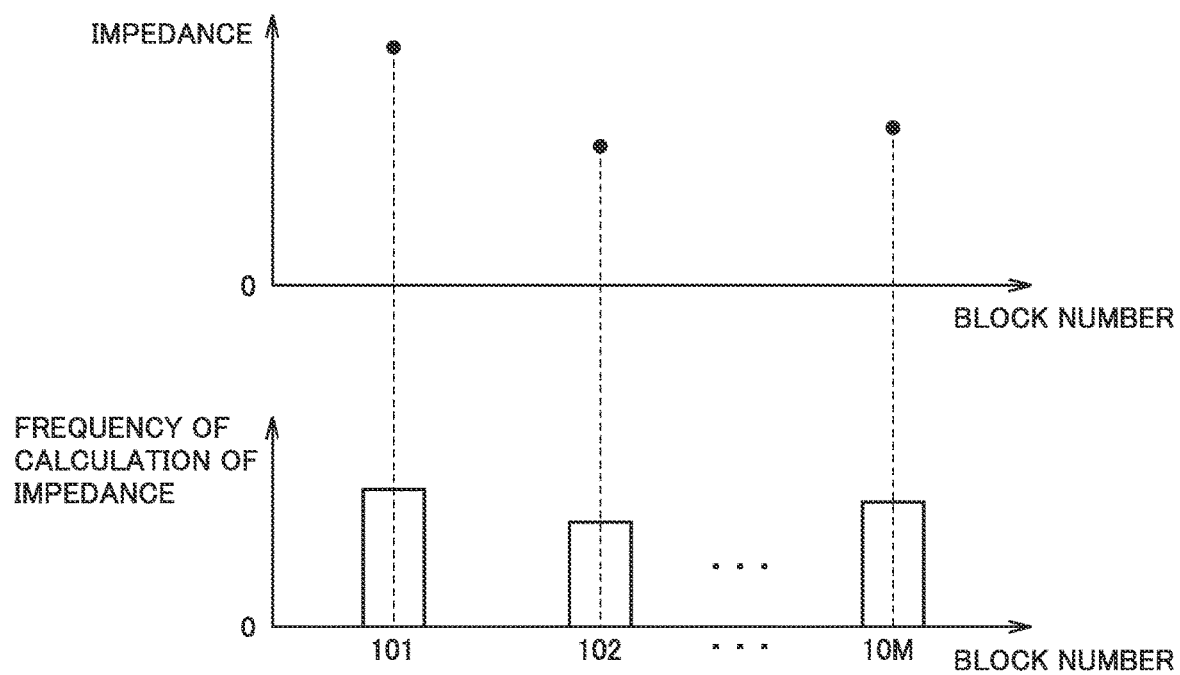
FIG. 20 is a conceptual diagram for illustrating another technique of obtaining data in a modification of the third embodiment.

FIG. 20 is a conceptual diagram for illustrating another technique of obtaining data in a modification of the third embodiment. In FIG. 20, the abscissa represents a block number. The ordinate represents an impedance of blocks 101 to 10M (at least one of impedance components for each frequency bandwidth) and a frequency of calculation from the top.

As shown in FIG. 20, as an impedance of a block is higher, a frequency of calculation of an impedance of that block may be set to be higher. Since an impedance of block 101 among blocks 101, 102, and 10M is highest in the example shown in FIG. 20, a frequency of calculation of an impedance of block 101 is set to be highest. Since an impedance of block 10M is second highest, a frequency of calculation of an impedance of block 10M is set to be second highest. Since an impedance of block 102 is lowest, a frequency of calculation of an impedance of block 102 is set to be lowest.

By thus setting a frequency of calculation of an impedance to be higher as the impedance is higher, a block high in impedance can be monitored with higher importance being placed thereon. Therefore, for example, when an impedance of a block of which impedance has increased further increases, such increase can promptly be detected and control for suppressing excessive increase in impedance can be carried out.

Figure 21:
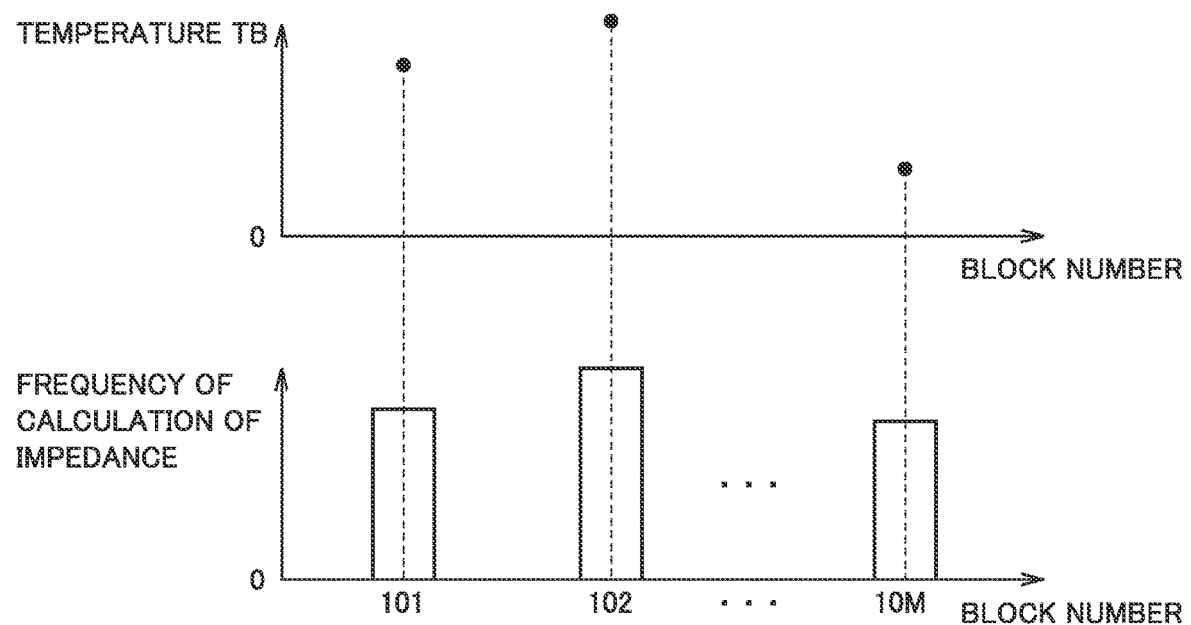
FIG. 21 is a conceptual diagram for illustrating yet another technique of obtaining data in a modification of the third embodiment.

FIG. 21 is a conceptual diagram for illustrating yet another technique of obtaining data in a modification of the third embodiment. In FIG. 21, the abscissa represents a block number. The ordinate represents temperature TB of a block and a frequency of calculation of an impedance from the top.

Referring to FIG. 21, among blocks in battery 10, a temperature distribution may be uneven or an SOC distribution may be uneven. When the temperature distribution is uneven among the blocks, the block higher in temperature may be faster in progress of deterioration and hence a frequency of calculation of an impedance is set to be high. Since temperature TB of block 102 among blocks 101, 102, and 10M is highest in the example shown in FIG. 21, a frequency of calculation of an impedance of block 102 is set to be highest. Since temperature TB of block 101 is second highest, a frequency of calculation of an impedance of block 101 is set to be second highest. Since temperature TB of block 10M is lowest, a frequency of calculation of an impedance of block 10M is set to be lowest.

By thus setting a frequency of calculation of an impedance to be higher for a block higher in temperature, a block of which deterioration is likely to proceed with increase in temperature can be monitored with higher importance being placed thereon.

Though an example in which a temperature distribution is uneven among the blocks has been described, a frequency of calculation of an impedance may be set in accordance with a difference in SOC among the blocks. Initially, correlation between an SOC and a degree of progress of deterioration is found through measurement in advance. Then, a frequency of calculation of an impedance of a block with an SOC exhibiting higher tendency toward progress of deterioration (typically, a block with a higher SOC) is set to be higher.

FIG. 2 illustrates the configuration in which a single current sensor 22 is provided in battery 10 by way of example. In a configuration in which a plurality of current sensors are provided in battery 10, however, a frequency of calculation of an impedance may be set in accordance with detection values from the current sensors. Initially, correlation between a current and a degree of progress of deterioration is found through measurement in advance. Then, a frequency of calculation of an impedance of a block or a cell in which a current exhibiting higher tendency toward progress of deterioration flows (typically, a block or a cell where a high current flows) is set to be higher.

Though FIGS. 19 to 21 illustrate examples in which an impedance is calculated for each block, limitation to calculation for each block is not intended. For example, an impedance component may be calculated every multiple adjacent blocks. In this case, an average value of voltages VB of a plurality of blocks (which may be a maximum value or a minimum value) may be employed as a voltage to be used for calculation of an impedance. It is not necessary to evenly group cells, and an impedance may be calculated every single cell or every two or more cells unlike a block.

In the modification of the third embodiment as well, as described with reference to FIG. 10 in the first embodiment, impedance components calculated from data during a plurality of data acquisition periods can be subjected to averaging processing for lessening influence by noise (temporal averaging processing). When an impedance component is calculated for each block or each cell, influence by noise can further be lessened by performing processing for averaging impedance components among a plurality of blocks or a plurality of cells (spatial averaging processing). In that case, averaging processing is preferably performed every multiple adjacent blocks (or cells) because a temperature is an important parameter which affects deterioration of secondary batteries and multiple adjacent blocks (or cells) are often close to one another in temperature.

Fourth Embodiment

In general, when a high current flows in a battery for a certain period, a temperature distribution in the battery may be uneven due to heat generation by the battery and a distribution of a salt concentration in an electrolyte or a distribution of a concentration of a charge transport material in an active material (which is comprehensively referred to as a "concentration distribution") in the battery (more specifically, in the cell) may be uneven. A result of calculation of an impedance in a state with such unevenness may be different from a result of calculation in a state substantially free from unevenness. When a temperature distribution or a concentration distribution is uneven, accuracy in calculation of an impedance component may be low. A configuration in which an impedance component for each frequency bandwidth is calculated in consideration of influence by unevenness in temperature distribution and concentration distribution will be described in a fourth embodiment. Since the overall configuration of the vehicle and the configuration of the secondary battery system in the fourth embodiment are comparable to the configurations in the first embodiment (see FIG. 1), detailed description will not be repeated.

Figure 22:
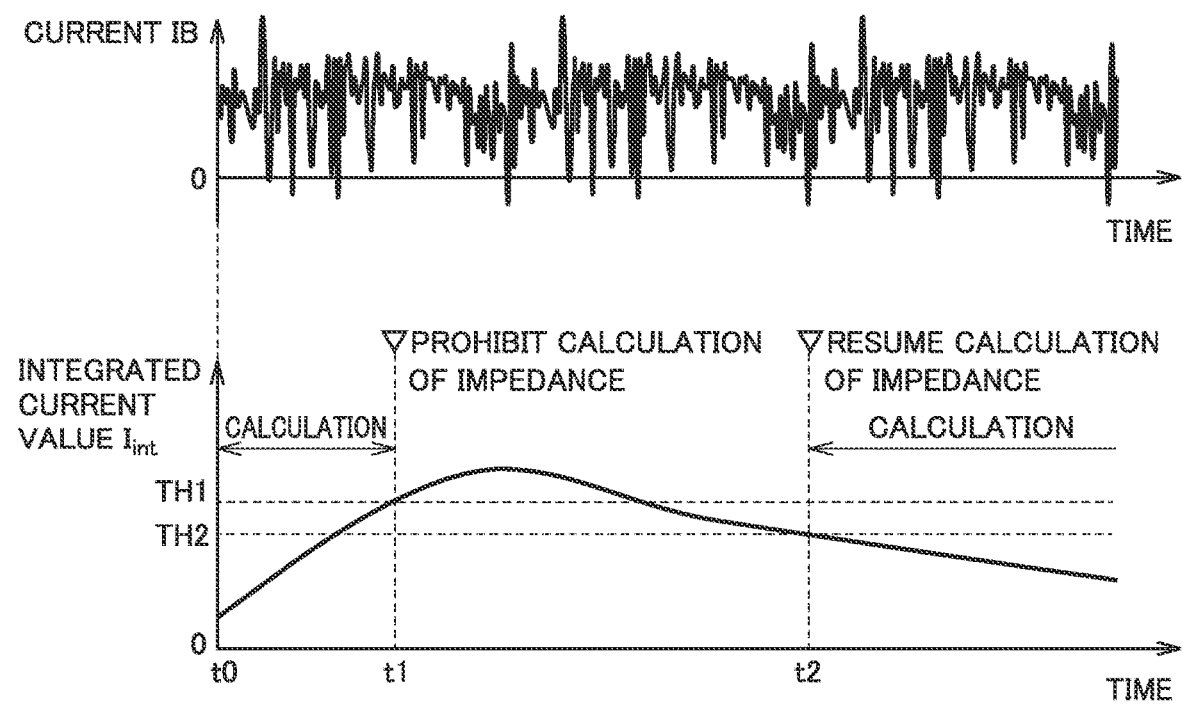
FIG. 22 is a time chart for illustrating a method of determining a deteriorated state of the battery in a fourth embodiment.

FIG. 22 is a time chart for illustrating a method of determining a deteriorated state of battery 10 in the fourth embodiment. In FIG. 22, the abscissa represents elapsed time. The ordinate represents current IB and an integrated current value $I_{int}$ of battery 10 from the top. Integrated current value $I_{int}$ means a value (unit: A·s) resulting from integration of currents IB for an immediately preceding prescribed period. Integrated current value $I_{int}$ corresponds to the "parameter" according to the present disclosure. A prohibition threshold value TH1 and a resumption threshold value TH2 smaller than prohibition threshold value TH1 are set for integrated current value $I_{int}$.

FIG. 23 is a diagram showing one example of a map MP2 for setting prohibition threshold value TH1 and resumption threshold value TH2. As shown in FIG. 23, for example, prohibition threshold value TH1 and resumption threshold value TH2 can be determined for each range of an average temperature $TB_{ave}$ of battery 10. A specific numeric value is by way of example for facilitating understanding of map MP2.

Referring back to FIG. 22, when integrated current value $I_{int}$ is equal to or greater than prohibition threshold value TH1 at time t1, calculation of an impedance component for each frequency bandwidth is prohibited. More specifically, an amount of change in data ($\Delta$IB, $\Delta$TB, and $\Delta$SOC) or an allowable amount of change ($\Delta IB_{max}$, $\Delta TB_{max}$, and $\Delta SOC_{max}$) is not calculated and hence data thereof is not subjected to FFT either.

Thereafter, a state that calculation of an impedance component is prohibited is maintained. Unevenness in temperature distribution or salt concentration distribution in the secondary battery caused by a high current is mostly temporary. When current IB is lower to some extent, unevenness can be relaxed (eliminated) over time. Therefore, when integrated current value $I_{int}$ is smaller than resumption threshold value TH2 at time t2, calculation of an impedance component is resumed. Prohibition threshold value TH1 corresponds to the "reference value" according to the present disclosure and resumption threshold value TH2 corresponds to "another reference value" according to the present disclosure.

FIG. 24 is a flowchart showing a method of determining a deteriorated state of battery 10 in the fourth embodiment. Referring to FIG. 24, in S510, ECU 100 calculates integrated current value $I_{int}$ by integrating currents IB during a prescribed period. In S512, ECU 100 calculates prohibition threshold value TH1 and resumption threshold value TH2 based on average temperature $TB_{ave}$ during the prescribed period by referring to map MP2 (see FIG. 23).

ECU 100 determines in S520 whether or not integrated current value $I_{int}$ is equal to or greater than prohibition threshold value TH1. When integrated current value $I_{int}$ is smaller than prohibition threshold value TH1 (NO in S520), ECU 100 determines that there is no unevenness in temperature distribution or concentration distribution in battery 10 and skips processing in subsequent S522, S530, and S532. The process proceeds to S540 and ECU 100 performs determination preparation processing. The determination preparation processing is comparable to the determination preparation processing (processing in S100 in FIG. 7) in the first embodiment.

When integrated current value $I_{int}$ is equal to or greater than prohibition threshold value TH1 (YES in S520), ECU 100 determines that a temperature distribution or a concentration distribution in battery 10 is highly likely to be uneven and prohibits calculation of an impedance component for each frequency bandwidth of battery 10 (S522).

ECU 100 determines in S530 whether or not integrated current value $I_{int}$ is smaller than resumption threshold value TH2. When integrated current value $I_{int}$ is equal to or greater than resumption threshold value TH2 (NO in S530), the process returns to S522 and ECU 100 maintains a state that calculation of an impedance component for each frequency bandwidth is prohibited.

When integrated current value $I_{int}$ is smaller than resumption threshold value TH2 (YES in S530), ECU 100 determines that unevenness in temperature distribution and concentration distribution in battery 10 has been relaxed and determines that calculation of an impedance component for each frequency bandwidth of battery 10 can be resumed (S532). The process proceeds to S540 and ECU 100 performs the determination preparation processing.

As set forth above, according to the fourth embodiment, when integrated current value $I_{int}$ is greater than prohibition threshold value TH1, it is determined that a temperature distribution or a concentration distribution in battery 10 (in cell 11) is highly likely to be uneven and calculation of an impedance component for each frequency bandwidth is prohibited. Thereafter, when integrated current value $I_{int}$ is smaller than resumption threshold value TH2, it is determined that unevenness in temperature distribution and unevenness in concentration distribution have been relaxed over time and calculation of an impedance component is resumed. Thus, since it is ensured that there is no unevenness in temperature distribution and salt concentration distribution in battery 10 at the time of calculation of an impedance component for each frequency bandwidth, accuracy in calculation of an impedance component can be improved. Consequently, accuracy in estimation of a deteriorated state of battery 10 can be improved.

An example in which integrated current value $I_{int}$ is used for determination as to whether or not a temperature distribution or a concentration distribution in battery 10 is uneven is described in the fourth embodiment. For example, when a plurality of temperature sensors are provided in battery 10, however, a degree of unevenness in temperature distribution may be determined based on detection values from those sensors. Though details are not described, whether or not a concentration distribution is uneven can also be determined by using a known simulation technique based on fluid dynamics.

Though embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

What is claimed is:

1. A method of estimating a deteriorated state of a secondary battery performed by a control device mounted on a vehicle, the method comprising:
   obtaining a plurality of times, a voltage value and a current value of the secondary battery mounted on the vehicle for a prescribed period during the vehicle driving and storing the voltage value and the current value in a memory;
   calculating an amount of change in current of the secondary battery, an amount of change in temperature of the secondary battery, and an amount of change in SOC of the secondary battery during the prescribed period;
   obtaining an allowable amount of change in current, an allowable amount of change in temperature, and an allowable amount of change in SOC which are determined for each temperature, each current, or each SOC of the secondary battery during the prescribed period from the temperature, the current, or the SOC of the secondary battery, the allowable amount of change in current representing an allowable upper limit of the amount of change in current, the allowable amount of change in temperature representing an allowable upper limit of the amount of change in temperature, the allowable amount of change in SOC representing an allowable upper limit of the amount of change in SOC;
   calculating, by subjecting voltage values and current values of the secondary battery obtained the plurality of times and stored in the memory to frequency conversion, an impedance component for each frequency bandwidth of the secondary battery based on the frequency-converted voltage values and current values when all of a current condition, a temperature condition, and an SOC condition are satisfied, the current condition being a condition that the amount of change in current is smaller than the allowable amount of change in current, the temperature condition being a condition that the amount of change in temperature is smaller than the allowable amount of change in temperature, the SOC condition being a condition that the amount of change in SOC is smaller than the allowable amount of change in SOC; and
   estimating a deteriorated state of the secondary battery in a deterioration mode in accordance with each frequency bandwidth by using the impedance component for each frequency bandwidth.

2. The method of estimating a deteriorated state of a secondary battery according to claim 1, wherein
   the obtaining an allowable amount of change includes obtaining the allowable amount of change in current, the allowable amount of change in temperature, and the allowable amount of change in SOC from an average temperature, an average current, or an average SOC of the secondary battery by referring to correspondence between the average temperature, the average current, or the average SOC of the secondary battery during the prescribed period and the allowable amount of change in current, the allowable amount of change in temperature, and the allowable amount of change in SOC.

3. The method of estimating a deteriorated state of a secondary battery according to claim 1, wherein
   among impedance components for each frequency bandwidth, an impedance component in a frequency bandwidth where deterioration of the secondary battery is more likely to proceed is higher in frequency of calculation of the impedance component.

4. The method of estimating a deteriorated state of a secondary battery according to claim 1, the method further comprising prohibiting calculation of the impedance component for each frequency bandwidth in spite of all of the current condition, the temperature condition, and the SOC condition being satisfied, when a parameter representing at least one of unevenness of a temperature distribution in the secondary battery, unevenness of a salt concentration distribution in an electrolyte of the secondary battery, and unevenness of a concentration distribution of a charge transport material in an active material of the secondary battery is higher than a reference value.

5. The method of estimating a deteriorated state of a secondary battery according to claim 4, the method further comprising resuming calculation of the impedance component for each frequency bandwidth when all of the current condition, the temperature condition, and the SOC condition are satisfied and when the parameter is lower than another reference value smaller than the reference value.

6. A secondary battery system used as being mounted on a vehicle, the secondary battery system comprising:
   a secondary battery; and
   an estimator including a memory and configured to estimate a deteriorated state of the secondary battery, the estimator
- obtaining a voltage value and a current value of the secondary battery a plurality of times for a prescribed period while the vehicle is driven and having the memory store the voltage value and the current value,
- calculating an amount of change in current of the secondary battery, an amount of change in temperature of the secondary battery, and an amount of change in SOC of the secondary battery during the prescribed period,
- obtaining an allowable amount of change in current, an allowable amount of change in temperature and an allowable amount of change in SOC which are determined for each temperature, each current, or each SOC of the secondary battery during the prescribed period from the temperature, the current, or the SOC of the secondary battery, the allowable amount of change in current representing an allowable upper limit of the amount of change in current, the allowable amount of change in temperature representing an allowable upper limit of the amount of change in temperature, the allowable amount of change in SOC representing an allowable upper limit of the amount of change in SOC,
- calculating, by subjecting voltage values and current values of the secondary battery obtained the plurality of times and stored in the memory to frequency conversion, an impedance component for each frequency bandwidth of the secondary battery based on the frequency-converted voltage values and current values when all of a current condition, a temperature condition, and an SOC condition are satisfied, the current condition being a condition that the amount of change in current is smaller than the allowable amount of change in current, the temperature condition being a condition that the amount of change in temperature is smaller than the allowable amount of change in temperature, the SOC condition being a condition that the amount of change in SOC is smaller than the allowable amount of change in SOC, and
- estimating a deteriorated state of the secondary battery in a deterioration mode in accordance with each frequency bandwidth by using the impedance component for each frequency bandwidth.

* * * * *